US007338152B2

(12) United States Patent
Terakura et al.

(10) Patent No.: US 7,338,152 B2

(45) Date of Patent: Mar. 4, 2008

(54) INKJET HEAD

(75) Inventors: Tatsuo Terakura, Nagoya (JP); Hiroshi Murashima, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 395 days.

(21) Appl. No.: 10/915,388

(22) Filed: Aug. 11, 2004

(65) Prior Publication Data

US 2005/0062806 A1 Mar. 24, 2005

(30) Foreign Application Priority Data

Aug. 13, 2003 (JP) ............................. 2003-292773
Mar. 24, 2004 (JP) ............................. 2004-086416
Mar. 24, 2004 (JP) ............................. 2004-086417

(51) Int. Cl.
*B41J 2/045* (2006.01)
*B41J 2/14* (2006.01)

(52) U.S. Cl. .......................................... 347/72; 347/50

(58) Field of Classification Search .................. 347/50
See application file for complete search history.

(56) References Cited

U.S. PATENT DOCUMENTS 6,241,346 B1 * 6/2001 Takahashi .................... 347/70
2002/0080215 A1 6/2002 Sakaida et al.
2003/0030705 A1 2/2003 Koike et al.
2003/0112298 A1 6/2003 Sato et al.

FOREIGN PATENT DOCUMENTS

JP A 10-272798 10/1998
JP A 11-314361 11/1999
JP A 2003-165215 6/2003
JP A 2003-311956 11/2003

* cited by examiner

*Primary Examiner*—Stephen Meier
*Assistant Examiner*—Geoffrey S. Mruk
(74) *Attorney, Agent, or Firm*—Oliff & Berridge, PLC

(57) ABSTRACT

An inkjet head includes a flow-path unit and an actuator unit. The actuator unit includes a piezoelectric sheet, electrodes, and flexible printed circuit sheets. The electrodes are disposed on the piezoelectric sheet to correspond to pressure chambers, respectively. The flexible printed circuit sheets are disposed on the piezoelectric sheet while partially overlapping each other. Each of the electrodes includes a first and second end portions that are opposite to each other. At least a part of the electrodes of a first electrode group, which are adjacent to one end portion of a first flexible printed circuit sheet, include the contact portions at the first end portions thereof. At least a part of the electrodes of the second electrode group, which are adjacent to the one end portion of the first flexible printed circuit sheet, include the contact portions at the second end portions thereof.

17 Claims, 18 Drawing Sheets

| SIN (0) | SIN (1) | SIN (2) | WAVEFORM SIGNAL |
|---|---|---|---|
| 0 | 0 | 0 | FIRE 0 (NON-EJECTION) |
| 0 | 0 | 1 | FIRE 1 |
| 0 | 1 | 0 | FIRE 2 |
| 0 | 1 | 1 | FIRE 3 |
| 1 | 0 | 1 | FIRE 4 |
| 1 | 1 | 0 | FIRE 5 |
| 1 | 1 | 1 | FIRE 6 |
| 1 | 0 | 0 | FIRE 7 |

INKJET HEAD

BACKGROUND OF THE INVENTION

1. Field of the Invention

The present invention relates to an inkjet head used in an inkjet recording apparatus for ejecting ink onto a recording medium to perform printing.

2. Description of the Related Art

An inkjet head is formed so that ink supplied from an ink tank to manifolds is distributed into a plurality of pressure chambers and that pulse-like pressure is selectively applied to the plurality of pressure chambers to thereby eject ink from a nozzle connected to each selected pressure chamber. As a device for applying pressure to the plurality of pressure chambers selectively as described above, there has been proposed an inkjet head having ceramic piezoelectric sheets disposed so as to be laid over the plurality of pressure chambers (e.g. see JP-A-2003-165215 (Page 5; and FIG. 5)).

In the inkjet head, a plurality of piezoelectric sheets are disposed stratiformly over the plurality of pressure chambers arranged on a plane. A plurality of surface electrodes that is formed so as to be long and narrow in one direction and correspond to the plurality of pressure chambers respectively are provided in the form of a matrix on the uppermost piezoelectric sheet of the laminated piezoelectric sheets. On the other hand, inner electrodes connected to the surface electrodes through through-holes and a common electrode provided so as to be common to the plurality of pressure chambers and kept at ground potential are provided between the plurality of piezoelectric sheets. A contact portion is provided at one end portion of each surface electrode. All the contact portions of the surface electrodes are arranged so as to face in one and same direction. Flexible printed circuit sheets (hereinafter referred to as FPC sheets) including signal lines for supplying the drive signals to the contact portions are disposed on an upper surface of the uppermost piezoelectric sheet. The FPC sheets are connected to the contact portions by means of soldering.

When a drive signal is supplied to the contact portion of a surface electrode through corresponding one of the signal lines of the FPC sheets, a voltage is applied between the surface electrode/inner electrode and the common electrode. Thus, the piezoelectric sheet is distorted to change the volume of a corresponding pressure chamber, to thereby eject ink from a nozzle connected to the pressure chamber.

SUMMARY OF THE INVENTION

An attempt to arrange a plurality of pressure cambers more densely has been made to satisfy both demands for higher print quality and smaller size of the inkjet head, in recent years. In this case, surface electrodes and contact portions corresponding to the plurality of pressure chambers respectively must be also arranged densely on the piezoelectric sheet. An FPC sheet on which a plurality of signal lines are wired for supplying drive signals to the contact portions respectively is however required when the contact portions are arranged densely on the piezoelectric sheet. The dense arrangement of such a plurality of signal lines on one single FPC sheet has a limitation. It may be therefore conceived that a plurality of FPC sheet shaving signal lines arranged relatively sparsely are disposed on the piezoelectric sheet so as to partially overlap one another.

In the inkjet head disclosed in JP-A-2003-165215, the upper FPC sheet of the plurality of FPC sheets is however apt to be peeled off in the neighbor of the boundary between the overlapping portion of the plurality of FPC sheets and the non-overlapping portion when the plurality of FPC sheets are disposed on the piezoelectric sheet so as to partially overlap one another in the aforementioned manner. Particularly if the distance between each contact portion near the boundary and the boundary is short in the condition that the contact portions are arranged densely as described above, there is a fear that electrical connection between the contact portion and the FPC sheet will be cut off when external force acts on the upper FPC sheet in a direction of peeling the upper FPC sheet.

The invention provides an inkjet head in which reliability on electrical connection between each contact portion and a corresponding FPC sheet is improved at a position near the boundary between the overlapping portion of FPC sheets and the non-overlapping portion when a plurality of FPC sheets are disposed on a piezoelectric sheet.

According to one embodiment of the invention, an inkjet head includes a flow-path unit and an actuator unit. The flow-path unit includes a plurality of pressure chambers that communicate with nozzles for ejecting ink, respectively. The actuator unit is disposed on a surface of the flow-path unit and changes volumes of the pressure chambers. The actuator unit includes a piezoelectric sheet, a plurality of electrodes, and a plurality of flexible printed circuit sheets. The piezoelectric sheet is disposed over the pressure chambers. The electrodes are disposed on the piezoelectric sheet to correspond to the pressure chambers, respectively. The flexible printed circuit sheets each includes a plurality of signal lines that are connected to contact portions of the electrodes, respectively and supply drive signals to the contact portions of the electrodes, respectively. The flexible printed circuit sheets are disposed on the piezoelectric sheet while partially overlapping each other. The flexible printed circuit sheets partially overlap each other on the piezoelectric sheet. The flexible printed circuit sheets include first and second flexible printed circuit sheets. The electrodes are divided into a plurality of electrode groups including first and second electrode groups. Each of the electrodes includes a first and second end portions that are opposite to each other. At least a part of the electrodes of the first electrode group, which are adjacent to one end portion of the first flexible printed circuit sheet, include the contact portions at the first end portions thereof. At least a part of the electrodes of the second electrode group, which are adjacent to the one end portion of the first flexible printed circuit sheet, include the contact portions at the second end portions thereof. The one end portion of the first flexible printed circuit sheet is located between the first and second electrode groups.

In this inkjet head, the actuator unit changes the volumes of the pressure chambers and increases the pressure of the pressure chambers, to thereby eject ink from a nozzle connected to the pressure chamber. In the actuator unit, when the drive signal is supplied to the contact portion of the electrode through the signal lines of the flexible printed circuit (FPC) boards, a voltage is applied to the electrode to distort the piezoelectric sheet, to thereby change the volume of the pressure chamber on the basis of the distortion of the piezoelectric sheet.

Incidentally, the plurality of FPC sheets are disposed on the piezoelectric sheet to partially overlap each other. For this reason, the first FPC sheet is apt to be peeled in the neighbor of the boundary portion between the first portion and the second portion. Accordingly, if the distance between each contact portion near the one end portion of the first FPC and the one end portion of the first FPC is short, electrical connection between the contact portion and the first FPC sheet is cut off so easily that reliability on the electrical connection is reduced. Therefore, the at least a part of the electrodes of the first electrode group, which are adjacent to one end portion of the first flexible printed circuit sheet, include the contact portions at the first end portions thereof. Also, the at least a part of the electrodes of the second electrode group, which are adjacent to the one end portion of the first flexible printed circuit sheet, include the contact portions at the second end portions thereof. As a result, the distance between the contact portion near the one end portion of the first FPC and the one end portion of the first FPC can be elongated. As a result, the first FPC sheet and the contact portion can be connected to each other at a position as far as possible from the one end portion of the first FPC sheet in which the first FPC sheet is apt to be peeled. Hence, reliability on electrical connection at the contact portion can be improved.

DETAILED DESCRIPTION OF THE PREFERRED EMBODIMENT

Figure 1:
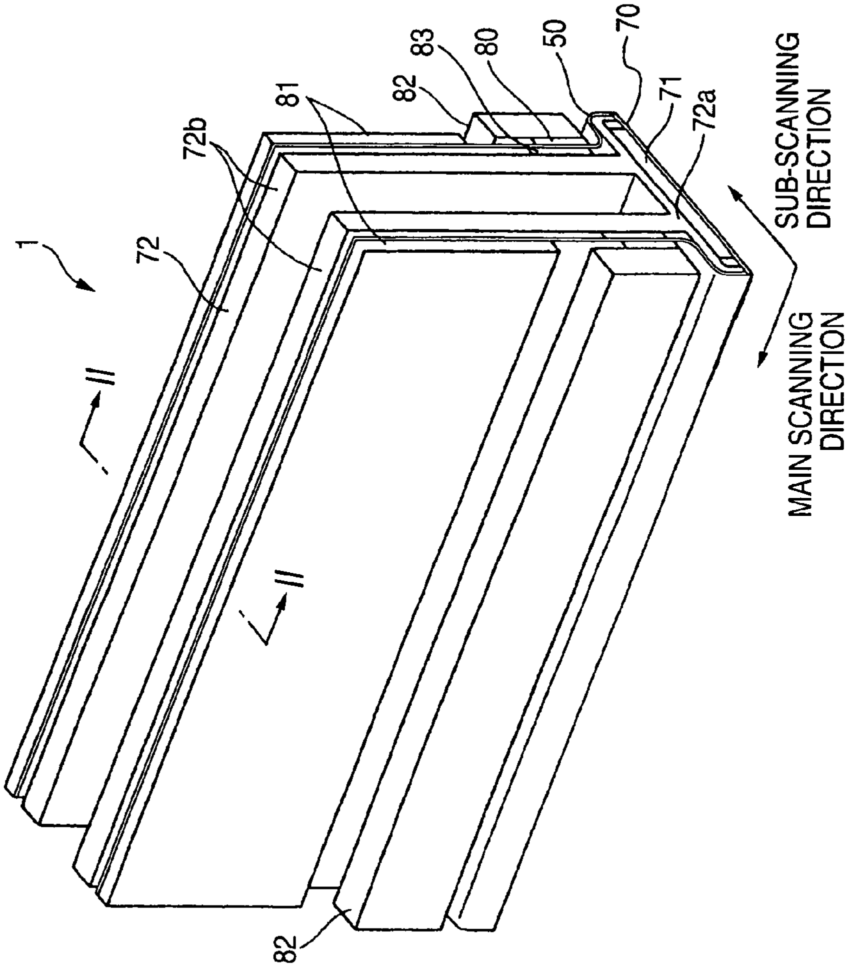
FIG. 1 is a perspective view of an inkjet head according to an embodiment of the invention.
Figure 2:
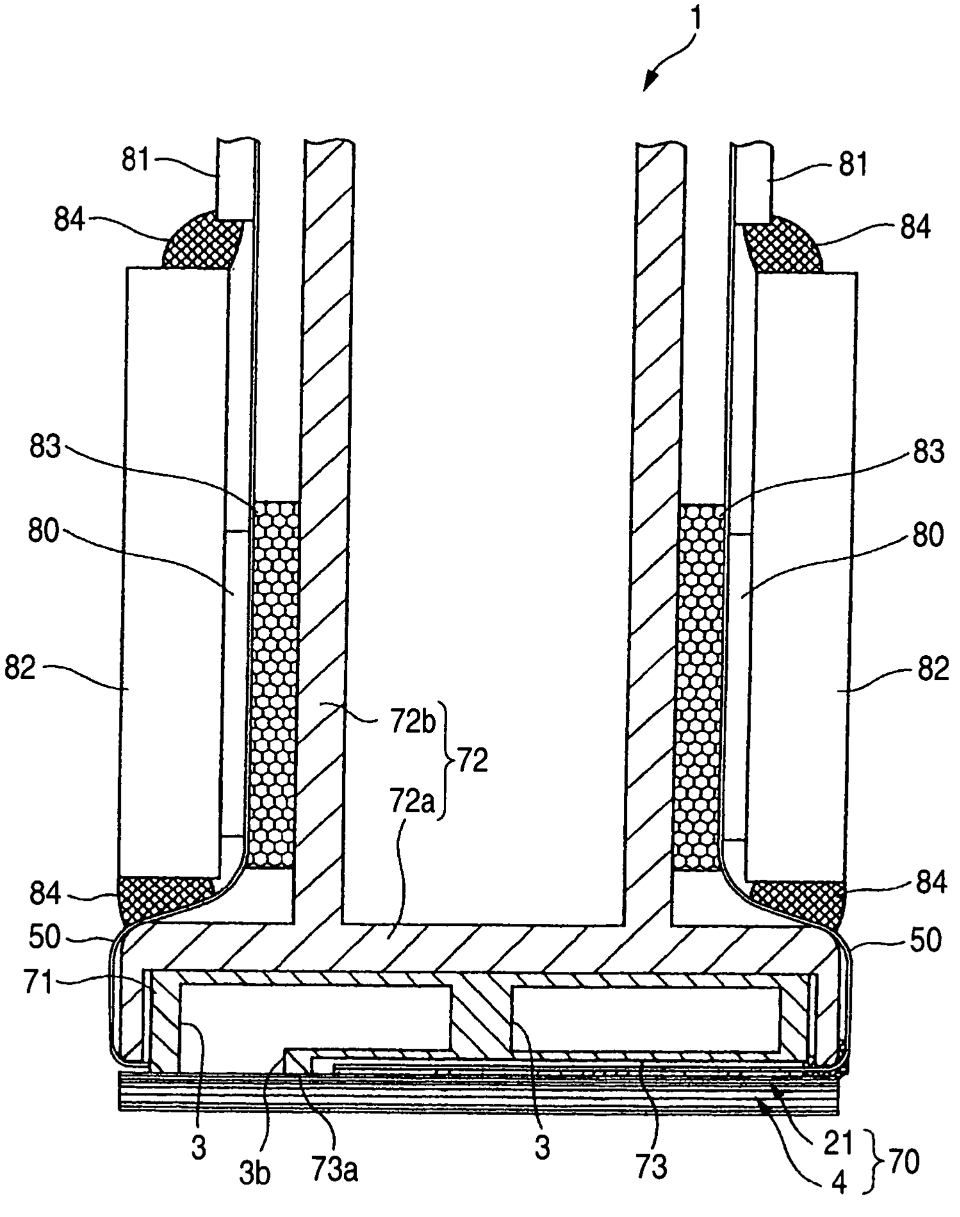
FIG. 2 is a sectional view taken along the line II-II in FIG. 1.

An embodiment of the invention will be described below. As shown in FIGS. 1 and 2, an inkjet head 1 according to this embodiment has a head body 70, and a base block 71. The head body 70 has a rectangle shape extending in a main scanning direction in the plan view and ejects ink onto a sheet of paper. The base block 71 is disposed above the head body 70 and includes two ink reservoirs 3 which are flow paths of ink supplied to the head body 70.

As shown in FIGS. 1 and 2, the head body 70 includes a flow path unit 4, and a plurality of actuator units 21. Ink flow paths are formed in the flow path unit 4. The plurality of actuator units 21 are bonded onto an upper surface of the flow path unit 4. The flow path unit 4 and actuator units 21 are formed in such a manner that a plurality of thin plates are laminated and bonded to one another. The actuator units 21 are provided with flexible printed circuit sheets 50 (hereinafter referred to as FPC sheets) which are feeder circuit members. The FPC sheets 50 are led out from the actuator units 21 to the left and right in FIG. 2. As will be described later, the FPC sheets 50 are formed in such a manner that two FPC sheets (see FIG. 8 and FIGS. 11A and 11B) are led out to the left and right while partially overlapping each other. For example, the base block 71 is made of a metal material such as stainless steel. Each of the ink reservoirs 3 in the base block 71 is a nearly rectangular parallelepiped hollow region formed along a longitudinal direction (a main scanning direction) of the base block 71.

A lower surface 73 of the base block 71 protrudes downward from its surroundings in neighbors of openings 3*b*. The base block 71 touches the flow path unit 4 only at neighbors 73*a* of the openings 3*b* of the lower surface 73. For this reason, all other regions than the neighbors 73*a* of the openings 3*b* of the lower surface 73 of the base block 71 are isolated from the head body 70 so that the actuator units 21 are disposed in the isolated portions.

The base block 71 is bonded and fixed into a cavity formed in a lower surface of a grip 72*a* of a holder 72. The holder 72 includes the grip 72*a*, and a pair of flat plate-like protrusions 72*b* extending from an upper surface of the grip 72*a* in a direction perpendicular to the upper surface of the grip 72*a* so as to form a predetermined distance between each other. The FPC sheets 50 are disposed so as to go along surfaces of the protrusions 72*b* of the holder 72 through elastic members 83 such as sponges respectively. Driver ICs 80 are disposed on the FPC sheets 50 disposed on the surfaces of the protrusions 72*b* of the holder 72. As will be described later, the FPC sheets 50 are electrically connected to the driver ICs 80 and electrodes 34 and 35 (see FIGS. 9A and 9B) of the actuator units 21 by soldering so that drive signals output from the driver ICs 80 are transmitted to the electrodes 34 and 35 of the actuator units 21.

Nearly rectangular parallelepiped heat sinks 82 are disposed closely on outer surfaces of the driver ICs 80, so that heat generated in the driver ICs 80 can be radiated efficiently. Boards 81 are disposed above the driver ICs 80 and the heat sinks 82 and outside the FPC sheets 50. An upper surface of each heat sink 82 and a corresponding board 81 are bonded to each other through a seal member 84. Similarly, a lower surface of each heat sink 82 and a corresponding FPC sheet 50 are bonded to each other through the seal member 84.

Figure 3:
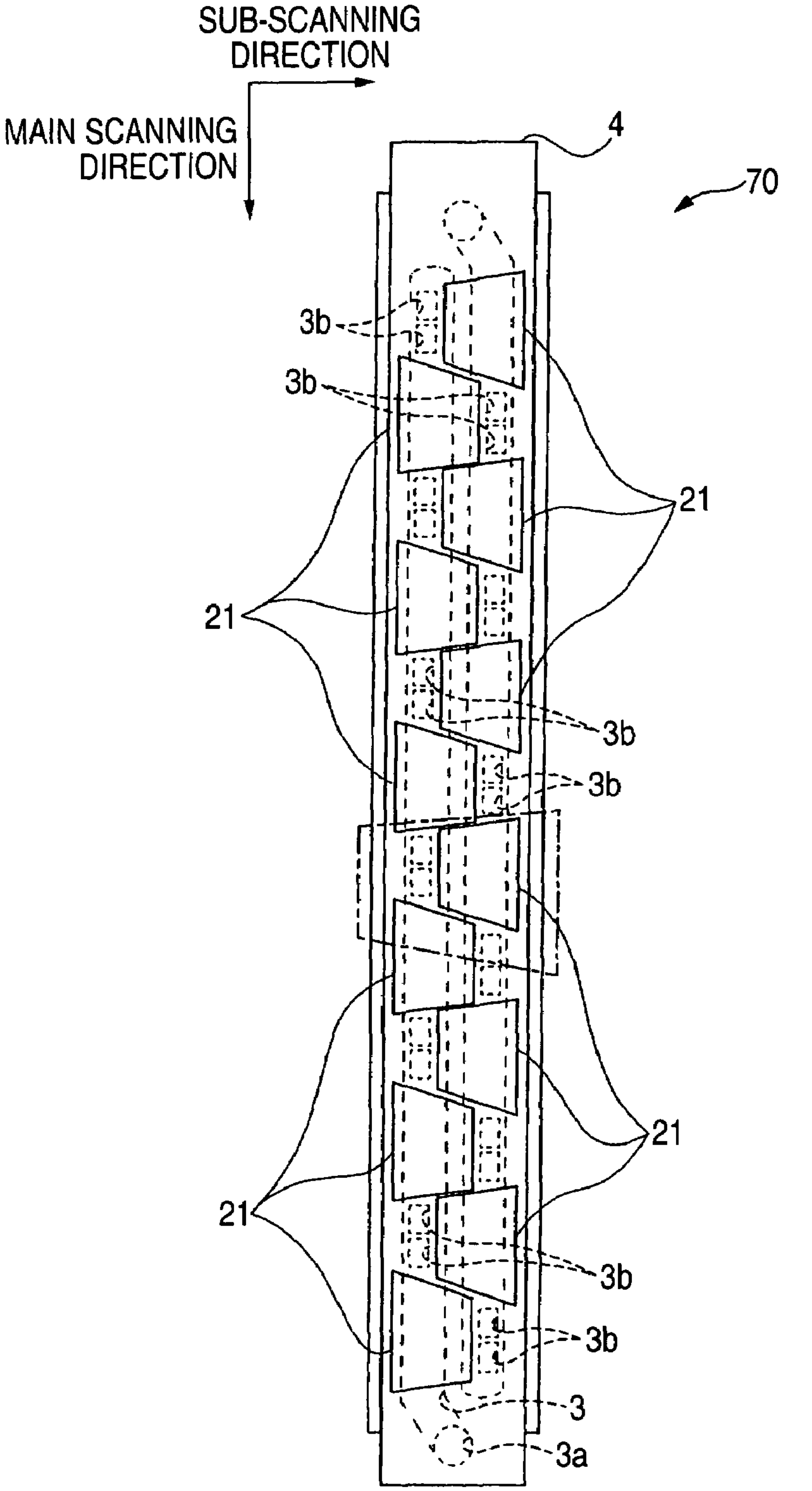
FIG. 3 is a plan view of a head body.

FIG. 3 is a plan view of the head body 70 depicted in FIG. 1. In FIG. 3, the ink reservoirs 3 formed in the base block 71 are drawn virtually by the broken line. The two ink reservoirs 3 extend in parallel to each other along the longitudinal direction of the head body 70 so as to form a predetermined distance between the two ink reservoirs 3. Each of the two ink reservoirs 3 has an opening 3*a* at its one end. The two ink reservoirs 3 communicate with an ink tank (not shown) through the openings 3*a* so as to be always filled with ink. A large number of openings 3*b* are provided in each ink reservoir 3 along the longitudinal direction of the head body 70. As described above, the ink reservoirs 3 are connected to the flow path unit 4 through the openings 3*b*. The large number of openings 3*b* are formed in such a manner that each pair of openings 3*b* are disposed closely along the longitudinal direction of the head body 70. The pairs of openings 3*b* connected to one ink reservoir 3 and the pairs of openings 3*b* connected to the other ink reservoir 3 are disposed in zigzag.

The plurality of actuator units 21 (which mainly mean portions except the FPC sheets 50 in the following description of the flow path unit 4) each shaped like a trapezoid in plan view are disposed in regions where the openings 3*b* are not provided. The plurality of actuator units 21 are disposed in zigzag so as to have a pattern reverse to that of the pairs of openings 3*b*. Parallel opposed sides (upper and lower sides) of each actuator unit 21 are parallel to the longitudinal direction of the head body 70. Inclined sides of adjacent actuator units 21 partially overlap each other in a width direction of the head body 70.

Figure 4:
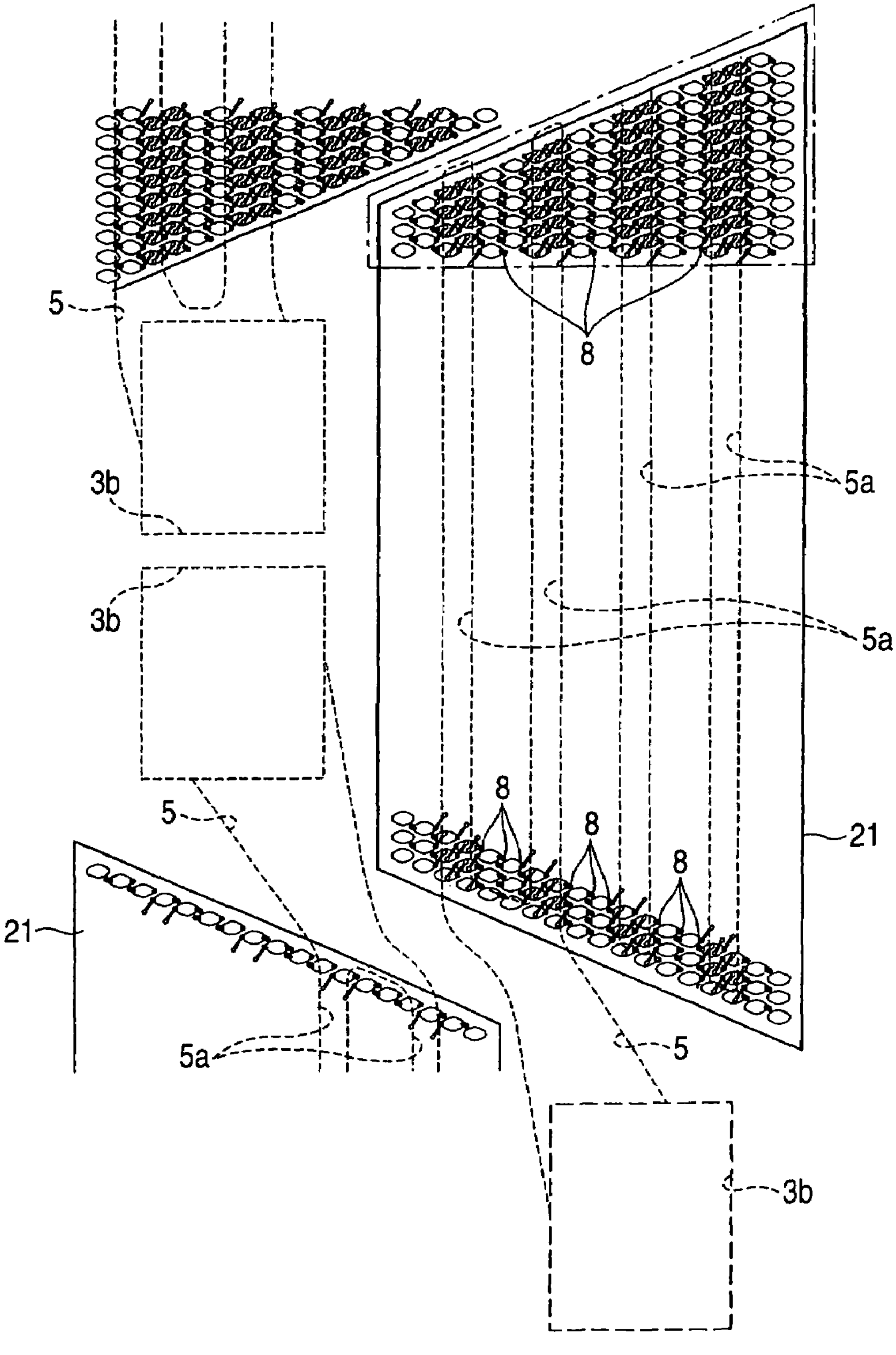
FIG. 4 is an enlarged view of a region surrounded by the chain line in FIG. 3.

FIG. 4 is an enlarged view of a region surrounded by the chain line in FIG. 3. As shown in FIG. 4, the openings 3*b* provided in each ink reservoir 3 communicate with manifolds 5 which are common ink chambers respectively. An end portion of each manifold 5 branches into two sub manifolds 5*a*. In plan view, every two sub manifolds 5*a* separated from adjacent openings 3*b* extend from two inclined sides of each actuator unit 21. That is, four sub manifolds 5*a* in total are provided below each actuator unit 21 and extend along the parallel opposed sides of the actuator unit 21 so as to be separated from one another.

A lower surface of the flow path unit 4 that faces the actuator units 21 makes up ink ejection regions. As will be described later, a large number of nozzles 8 are disposed in the form of a matrix in a surface of each ink ejection region. Although FIG. 4 shows several nozzles 8 for the sake of simplification, nozzles 8 are actually disposed on the whole of the ink ejection region.

Figure 5:
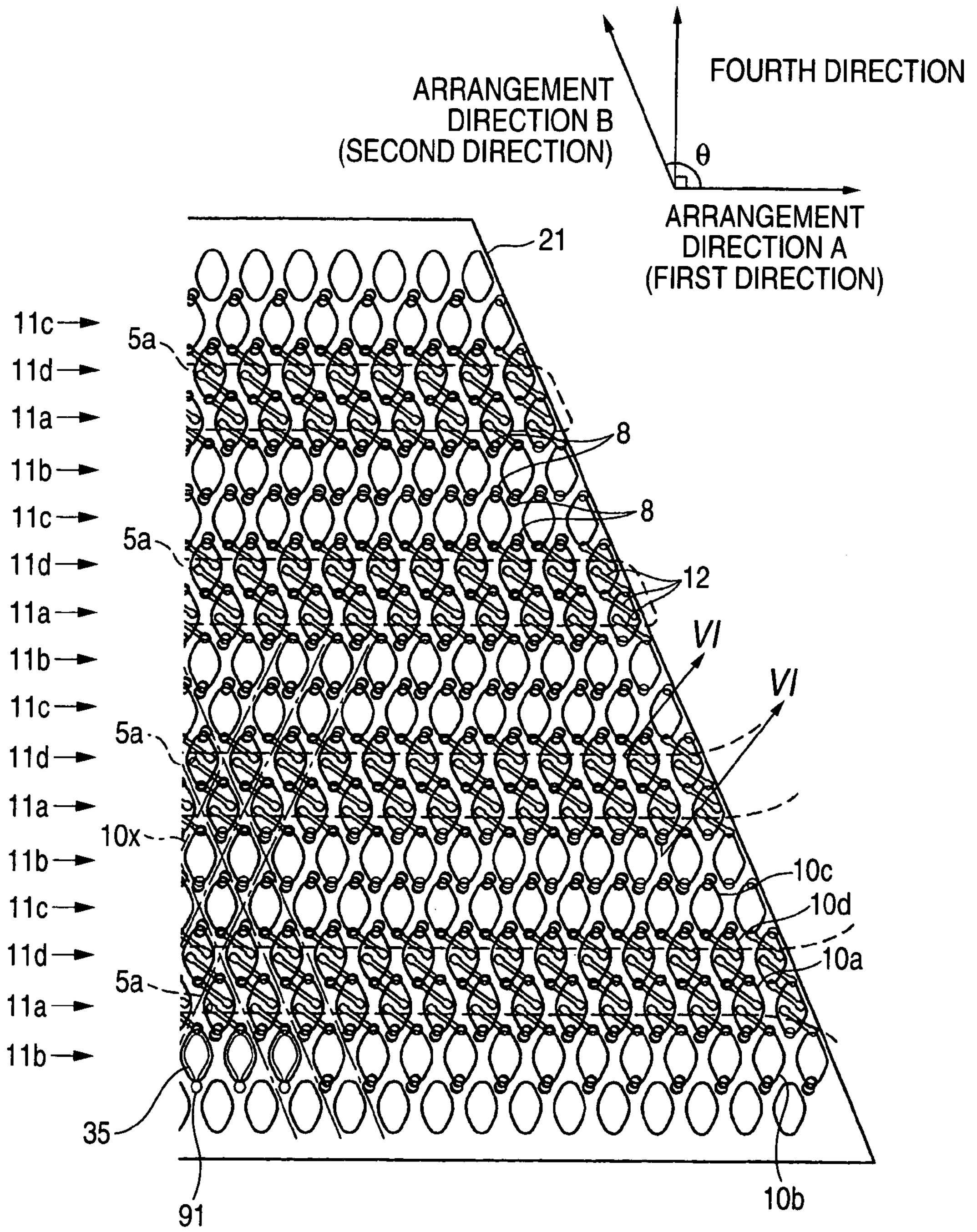
FIG. 5 is an enlarged view of a region surrounded by the chain line in FIG. 4.

FIG. 5 is an enlarged view of a region surrounded by the one-dot chain line in FIG. 4. FIGS. 4 and 5 show a state in which a plane of a large number of pressure chambers 10 disposed in the form of a matrix in the flow path unit 4 is viewed from a direction perpendicular to the ink ejection surface. Each of the pressure chambers 10 is substantially shaped like a rhomboid having rounded corners in plan view. The long diagonal line of the rhomboid is parallel to the width direction of the flow path unit 4. Each pressure chamber 10 has one end connected to a corresponding nozzle 8, and the other end connected to a corresponding sub manifold 5*a* functioning as a common ink path through an aperture 12 (see FIG. 6). An individual electrode 35 having a planar shape similar to but smaller by a size than each pressure chamber 10 is formed on the actuator unit 21 so as to be located in a position where the individual electrode 35 overlaps the pressure chamber 10 in plan view. Some of a large number of individual electrodes 35 are shown in FIG. 5 for the sake of simplification. Incidentally, the pressure chambers 10, apertures 12, etc. that must be expressed by the broken line in the actuator units 21 or in the flow path unit 4 are expressed by the solid line in FIGS. 4 and 5 to make it easy to understand the drawings.

In FIG. 5, a plurality of virtual rhombic regions 10*x* in which the pressure chambers 10 (10*a*, 10*b*, 10*c* and 10*d*) are stored respectively are disposed adjacently in the form of a matrix both in an arrangement direction A (first direction) and in an arrangement direction B (second direction) so that adjacent virtual rhombic regions 10*x* have common sides but do not overlapping each other. The arrangement direction A is a longitudinal direction of the inkjet head 1, that is, an extension direction of each sub manifold 5*a*. The arrangement direction A is parallel to the short diagonal line of each rhombic region 10*x*. The arrangement direction B is a direction of one inclined side of each rhombic region 10*x* so that an obtuse angle θ is formed between the arrangement direction B and the arrangement direction A. The central position of each pressure chamber 10 is common to that of a corresponding rhombic region 10*x*. However, the contour line of each pressure chamber 10 is separated from that of a corresponding rhombic region 10*x* in plan view.

The pressure chambers 10 disposed adjacently in the form of a matrix in the two directions, that is, in the arrangement directions A and B are formed at intervals of a distance corresponding to 37.5 dpi along the arrangement direction A. The pressure chambers 10 are formed so that sixteen pressure chambers are arranged in the arrangement direction B in one ink ejection region. Pressure chambers located at opposite ends in the arrangement direction B are dummy chambers that do not contribute to ink jetting.

The plurality of pressure chambers 10 disposed in the form of a matrix form a plurality of pressure chamber rows along the arrangement direction A shown in FIG. 5. The pressure chamber rows are separated into first pressure chamber rows 11*a*, second pressure chamber rows 11*b*, third pressure chamber rows 11*c* and fourth pressure chamber rows 11*d* in accordance with positions relative to the sub manifolds 5*a* viewed from a direction (third direction) perpendicular to the paper of FIG. 5. The first to fourth pressure chamber rows 11*a* to 11*d* are arranged cyclically in order of 11*c*→11*d*→11*a*→11*b* →11*c*→11*d*→ . . . →11*b* from an upper side to a lower side of each actuator unit 21.

In pressure chambers 10*a* forming the first pressure chamber row 11*a* and pressure chambers 10*b* forming the second pressure chamber row 11*b*, nozzles 8 are unevenly distributed on a lower side of the paper of FIG. 5 in a direction (fourth direction) perpendicular to the arrangement direction A when viewed from the third direction. The nozzles 8 are located in lower end portions of corresponding rhombic regions 10*x* respectively. On the other hand, in pressure chambers 10*c* forming the third pressure chamber row 11*c* and pressure chambers 10*d* forming the fourth pressure chamber row 11*d*, nozzles 8 are unevenly distributed on an upper side of the paper of FIG. 5 in the fourth direction. The nozzles 8 are located in upper end portions of corresponding rhombic regions 10*x* respectively. In the first and fourth pressure chamber rows 11*a* and 11*d*, regions not smaller than half of the pressure chambers 11*a* and 10*d* overlap the sub manifolds 5*a* when viewed from the third direction. In the second and third pressure chamber rows 11*b* and 11*c*, all the regions of the pressure chambers 10*b* and 10*c* do not overlap the sub manifolds 5*a* at all when viewed from the third direction. For this reason, pressure chambers 10 belonging to any pressure chamber row can be formed so that the sub manifolds 5*a* are widened as sufficiently as possible while nozzles 8 connected to the pressure chambers 10 do not overlap the sub manifolds 5*a*. Accordingly, ink can be supplied to the respective pressure chambers 10 smoothly.

Figure 6:
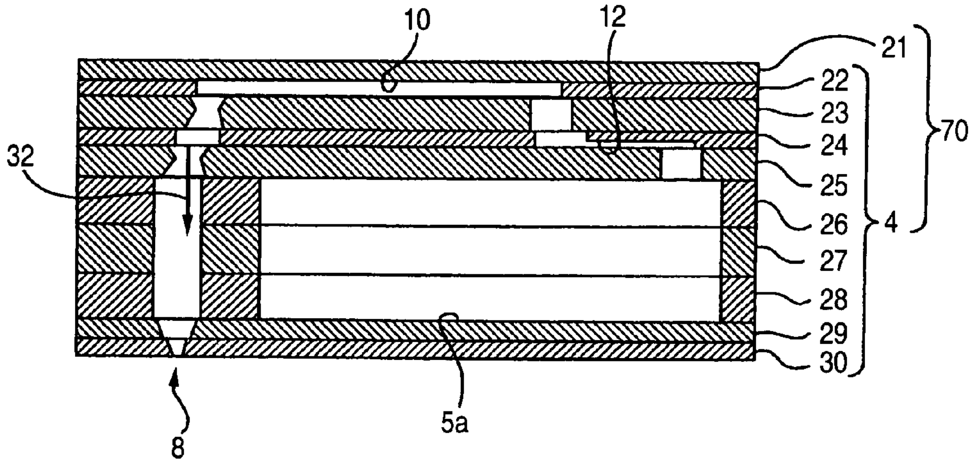
FIG. 6 is a sectional view taken along the line VI-VI in FIG. 5.

Next, the sectional structure of the head body 70 will sbe further described with reference to FIGS. 6 and 7. As shown in FIG. 6, each nozzle 8 communicates with a sub manifold 5*a* through a pressure chamber 10 (10*a* or 10*b*) and an aperture 12. In this manner, individual ink flow paths 32 are formed in the head body 70 for each pressure chambers 10 so that each individual ink flow path 32 extends from an outlet of the sub manifold 5*a* to the nozzle 8 through the aperture 12 and the pressure chamber 10. Incidentally, the individual ink flow path 32 (hereinafter, may be referred to as a channel) corresponds to a single recording element.

As shown in FIG. 6, the pressure chamber 10 and the aperture 12 are provided so as to be different in level from each other in the lamination direction of a plurality of thin plates. Accordingly, as shown in FIG. 5, in the flow path unit 4 corresponding to the ink ejection region below the actuator unit 21, the aperture 12 connected to one pressure chamber 10 can be disposed in the same position as that of a pressure chamber 10 adjacent to the pressure chamber in plan view. As a result, the pressure chambers 10 can be disposed so densely as to be close to one another, so that printing of a high-resolution image can be achieved by the inkjet head 1 though the ink-jet head 1 has a relatively small occupied area.

Figure 7:
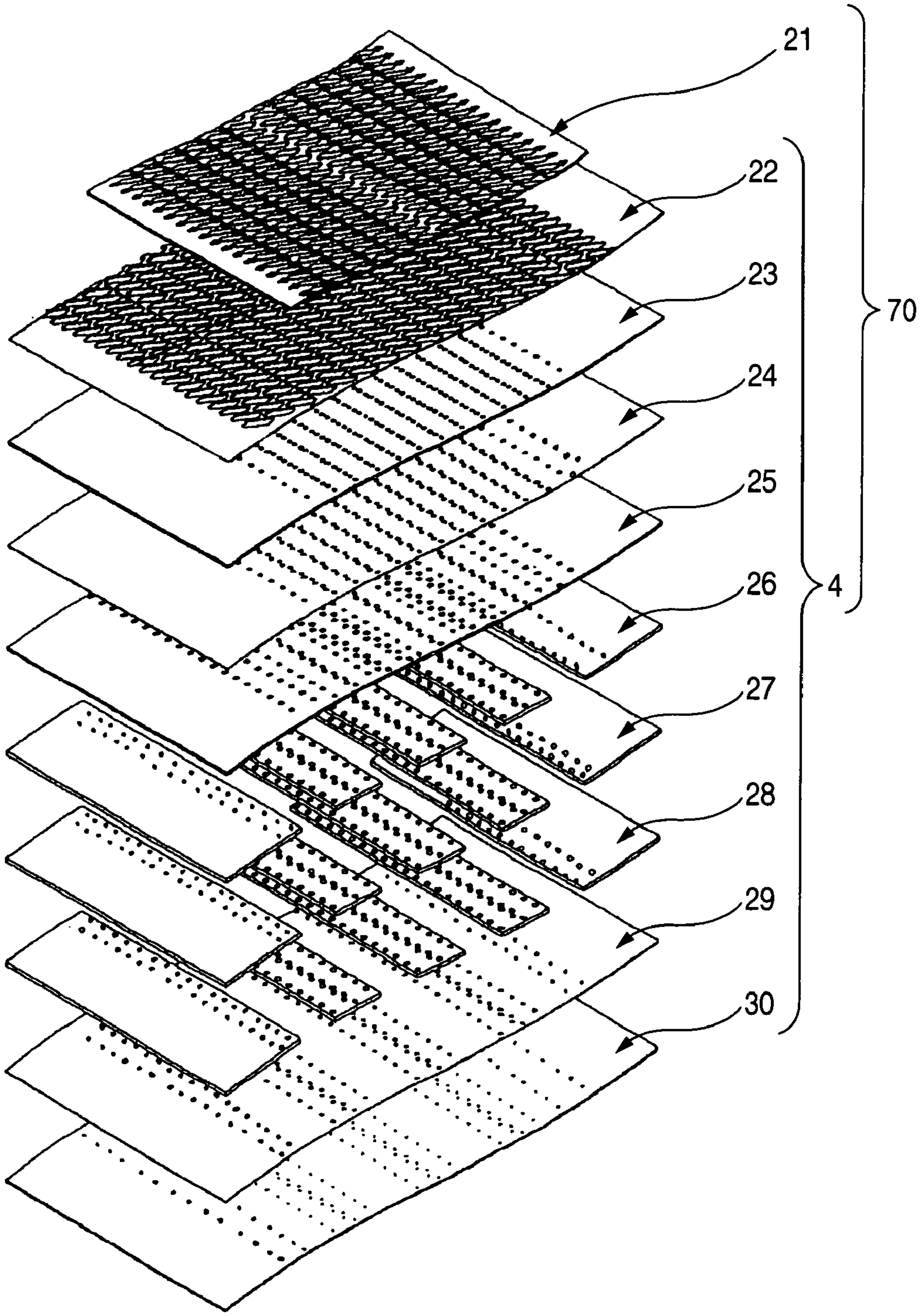
FIG. 7 is a partially exploded perspective view of the head body.

As shown in FIG. 7, the head body 70 has a laminated structure in which ten sheet members in total, namely, an actuator unit 21 (except FPC sheets 50), a cavity plate 22, abase plate 23, an aperture plate 24, a supply plate 25, manifold plates 26, 27 and 28, a cover plate 29 and a nozzle plate 30 are laminated on one another in descending order. The ten sheet members except the actuator unit 21, that is, nine sheet plates form the flow path unit 4.

As will be described later in detail, the actuator unit 21 includes a laminate of five piezoelectric sheets 41 to 45 (see FIG. 9A) as five layers, and electrodes disposed so that three layers of the five layers are provided as layers having portions serving as active layers at the time of application of electric field (hereinafter referred to as "active layer-including layers" simply) while the residual two layers are provided as non-active layers. The cavity plate 22 is a metal plate having a large number of nearly rhomboid openings corresponding to the pressure chambers 10. The base plate 23 is a metal plate which has holes each for connecting one pressure chamber 10 of the cavity plate 22 to a corresponding aperture 12, and holes each for connecting the pressure chamber 10 to a corresponding nozzle 8. The aperture plate 24 is a metal plate which has apertures 12, and holes each for connecting one pressure chamber 10 of the cavity plate 22 to a corresponding nozzle 8. Each aperture 12 is composed of two holes, and a half-etched region for connecting the two holes to each other. The supply plate 25 is a metal plate which has holes each for connecting an aperture 12 for one pressure chamber 10 of the cavity plate 22 to a corresponding sub manifold 5*a*, and holes each for connecting the pressure chamber 10 to a corresponding nozzle 8. The manifold plates 26, 27 and 28 are metal plates which have the sub manifolds 5*a*, and holes each for connecting one pressure chamber 10 of the cavity plate 22 to a corresponding nozzle 8. The cover plate 29 is a metal plate which has holes each for connecting one pressure chamber 10 of the cavity plate 22 to a corresponding nozzle 8. The nozzle plate 30 is a metal plate which has nozzles 8 each provided for one pressure chamber 10 of the cavity plate 22.

The ten sheets 21 to 30 are laminated on one another while positioned so that ink flow paths 32 are formed as shown in FIG. 6. Each ink flow path 32 first goes upward from the sub manifold 5*a*, extends horizontally in the aperture 12, goes further upward from the aperture 12, extends horizontally again in the pressure chamber 10, goes obliquely downward in the direction of departing from the aperture 12 for a while and goes vertically downward to the nozzle 8.

Next, the actuator unit 21 and the drive IC 80 electrically connected to the actuator unit 21 will be described with reference to FIGS. 8 to 16.

The actuator unit 21 includes five piezoelectric sheets 41 to 45 and a plurality of individual electrodes 35. The piezoelectric sheets 41 to 45 are disposed stratiformly so as to be laid over the pressure chambers 10. The individual electrodes 35 are provided on the uppermost piezoelectric sheet 41 so as to correspond to the pressure chambers 10 respectively and have contact portions 91 respectively. The two FPC sheets 50 (50*a* and 50*b*) having signal lines that supply drive signals to change the volume of the pressure chambers 10 are connected to the contact portions 91 of the individual electrodes 35. When the drive signals are supplied selectively from the driver IC 80 (see FIG. 2) through the FPC 50 to the contact portions 91 of the individual electrodes 35, the actuator unit 21 changes the volume of pressure chambers 10 corresponding to the contact portions 91 supplied with the drive signals.

Figure 8:
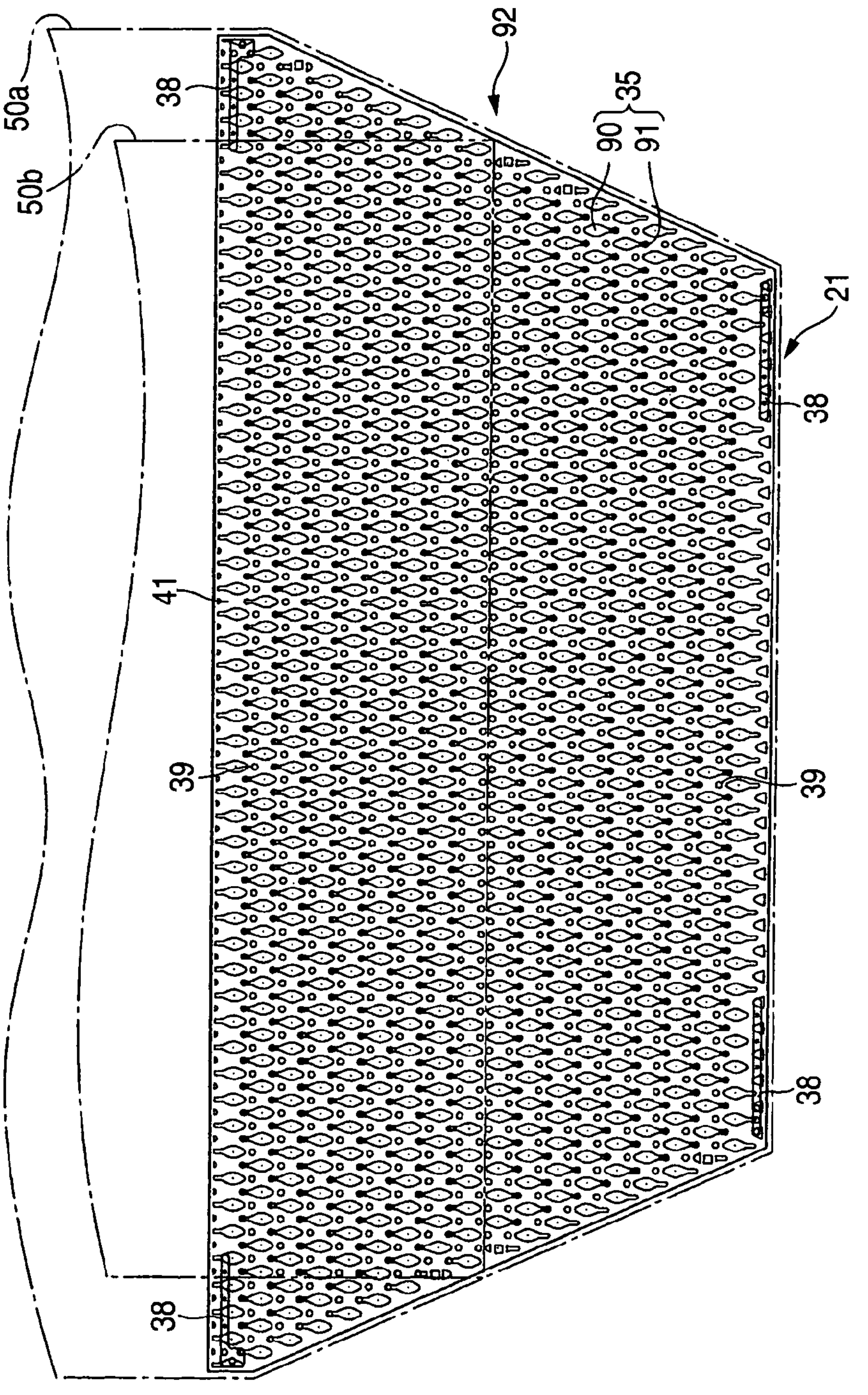
FIG. 8 is a plan view of an actuator unit.
Figure 9A:
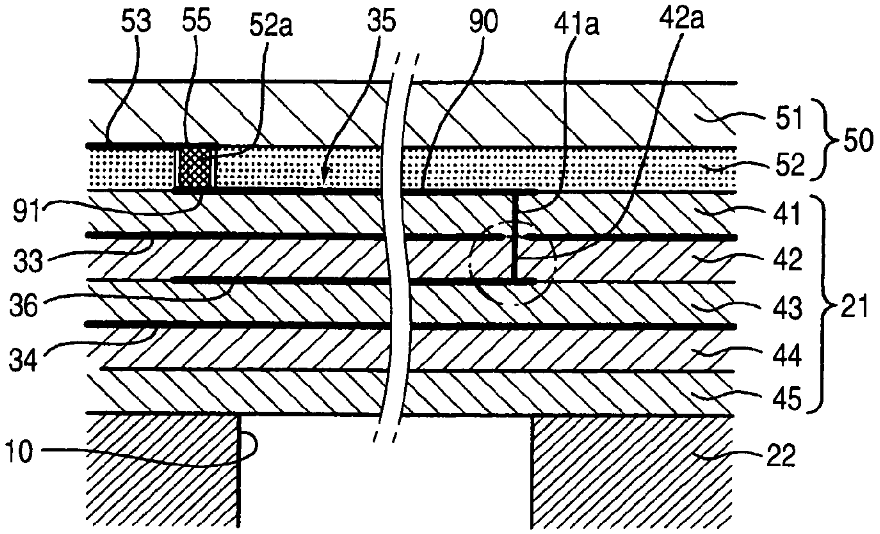
FIG. 9A is a sectional view showing the neighbor of an individual electrode in the actuator unit.
Figure 9B:
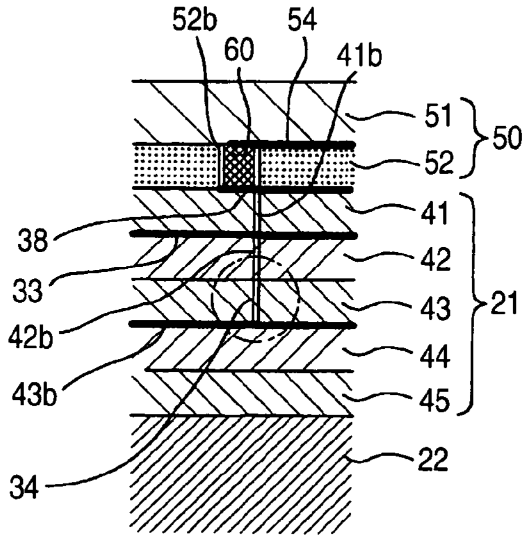
FIG. 9B is a sectional view showing the neighbor of a ground electrode in the actuator unit.

As shown in FIGS. 8, 9A and 9B, the five piezoelectric sheets 41 to 45 are formed to have a thickness of about 15 μm equally. The piezoelectric sheets 41 to 45 are provided as stratified flat plates (continuous flat plate layers) which are continued to one another so as to be laminated and arranged over a large number of pressure chambers 10 formed in one ink ejection region in the inkjet head 1.

As shown in FIG. 8, individual electrodes 35 each substantially shaped like a rhomboid in plan view are arranged regularly in the form of a matrix on the upper surface of the uppermost piezoelectric sheet 41. As shown in FIG. 9A, individual electrodes 36 each having the same shape as those of the individual electrodes 35 are arranged between the two piezoelectric sheets 42 and 43 so as to overlap the individual electrodes 35 respectively in the up-down direction. Because the piezoelectric sheets 41 to 45 are arranged as continuous flat plate layers over the large number of pressure chambers 10 as described above, the individual electrodes 35 and 36 can be arranged densely when, for example, a screen printing technique is used. Accordingly, the pressure chambers 10 formed in positions corresponding to the individual electrodes 35 and 36 can be also disposed densely, so that a high-resolution image can be printed.

In this embodiment, each of the piezoelectric sheets 41 to 45 is made of a ceramic material of the lead zirconate titanate (PZT) type having ferroelectricity. Although FIG. 9A shows the FPC sheet 50 and the piezoelectric sheet 41 as if the whole surfaces of the two are bonded to each other, the two are actually not bonded to each other at the main electrode portions 90 of the individual electrodes 35. This is for the purpose of preventing the FPC 5 bonded to the main electrode portions 90 from disturbing the deformation of the piezoelectric sheets 41 to 45.

Figure 10:
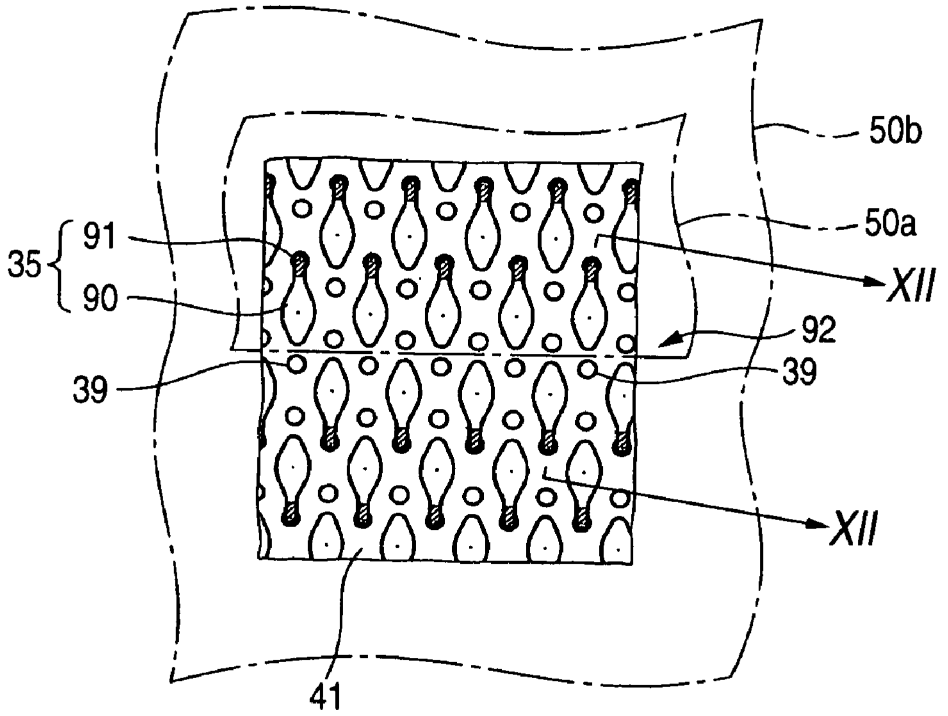
FIG. 10 is a partially enlarged view showing the neighbor of a boundary in FIG. 8.

As shown in FIGS. 8, 9A and 10, the individual electrodes 35 each having a thickness of about 1 μm are formed in positions on the upper surface of the piezoelectric sheet 41 and corresponding to the pressure chambers 10 respectively. Each of the individual electrodes 35 has a planar shape which is nearly similar to the shape of each pressure chamber 10 (see FIG. 5).

Each individual electrode 35 further has a main electrode portion 90 substantially shaped like a rhomboid in plan view, and a contact portion 91 (land portion) formed so as to protrude from an acute-angled portion provided at an end of the main electrode portion 90. The drive signals are supplied to the contact portions 91 through the signal lines arranged on the FPC sheet 50 as will be described later. As shown in FIGS. 5 and 9A, each main electrode portion 90 overlaps a corresponding pressure chamber 10 when viewed from the third direction perpendicular to the front surface of the piezoelectric sheet 41. On the other hand, a large part of each contact portion 91 does not overlap the pressure chamber 10 when viewed from the third direction. Incidentally, in FIG. 8, individual electrodes 35 located on the outermost circumferential sides among the individual electrodes 35 on the piezoelectric sheet 41 are dummy electrodes each having no contact portion 91.

Incidentally, the individual electrodes 35 arranged on an upper half of the piezoelectric sheet 41 (8 rows; 364 individual electrodes) in FIG. 8 have contact portions 91 provided at upper end portions of the individual electrodes 35 in FIG. 8. On the other hand, the individual electrodes 35 arranged on a lower half of the piezoelectric sheet 41 (8 rows; 300 individual electrodes) in FIG. 8 have contact portions 91 provided at lower end portions of the individual electrodes 35 in FIG. 8. This reason will be described later.

As shown in FIG. 9A, individual electrodes 36 each having a thickness of about 2 μm and the same shape as that of each individual electrode 35 are interposed between the piezoelectric sheet 42 and the piezoelectric sheet 43. On the other hand, no electrode is arranged between the piezoelectric sheet 44 adjacent to and under the piezoelectric sheet 43 and the piezoelectric sheet 45 adjacent to and under the piezoelectric sheet 44. Also, no electrode is arranged under the piezoelectric sheet 45.

Figure 9C:
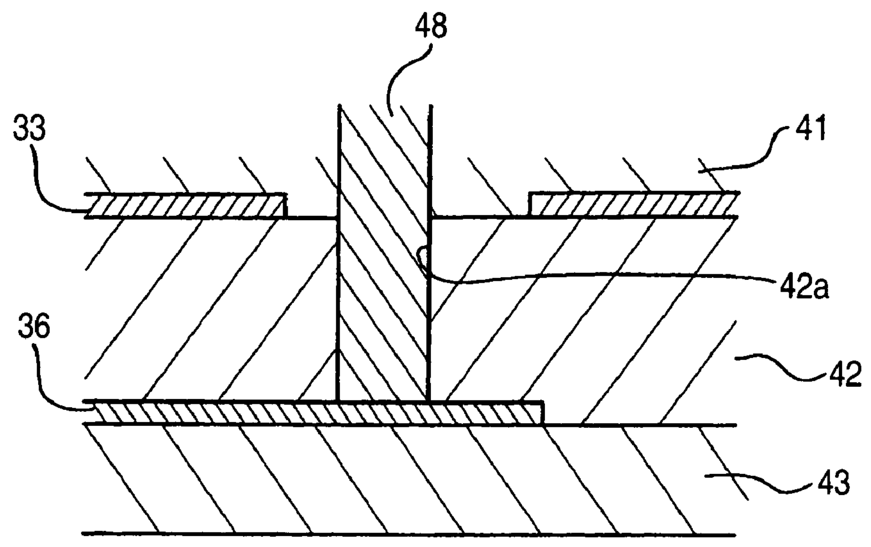
FIG. 9C is an enlarged view showing an encircled region in FIG. 9A.

As shown in FIG. 9A, through-holes 41*a* and 42*a* are formed in the piezoelectric sheets 41 and 42 respectively so that the through-holes 41*a* and 42*a* are disposed between each individual electrode 35 and a corresponding individual electrode 36 so as to extend downward from one end portion (end portion opposite to the contact portion 91) of the main electrode portion 90 of the individual electrode 35. As shown in FIG. 9C, the through-holes 41*a* and 42*a* are filled with an electrically conductive material (such as silver-palladium) 48. The two individual electrodes 35 and 36 corresponding to each pressure chamber 10 are connected to each other through the electrically conductive material 48.

As shown in FIG. 8, in this embodiment, ground electrodes 38 are formed in four corners of the upper surface of the piezoelectric sheet 41. A virtual region defined by the four ground electrodes 38 surrounds the region in which the individual electrodes 35 are formed on the upper surface of the piezoelectric sheet 41.

As shown in FIG. 9B, a common electrode 33 having a thickness of about 2 μm is located below each ground electrode 38 and is interposed between the uppermost piezoelectric sheet 41 of the actuator unit 21 and the piezoelectric sheet 42 located under the piezoelectric sheet 41. The common electrode 33 is constituted by a single electrically conductive sheet extending on the almost whole region of the piezoelectric sheets 41 to 45. Similarly, a common electrode 34 having a thickness of about 2 μm and having the same shape as that of the common electrode 33 is also interposed between the piezoelectric sheet 43 located as the third uppermost layer and the piezoelectric sheet 44 located under the piezoelectric sheet 43.

Figure 9D:
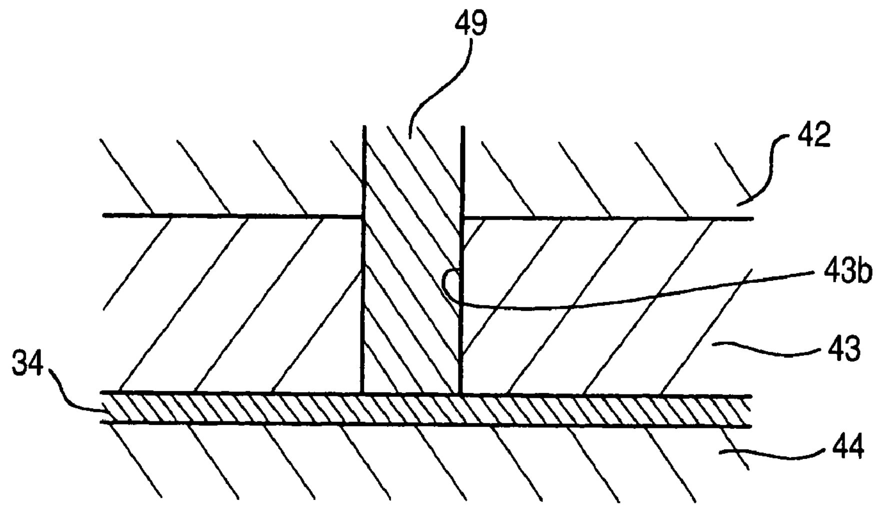
FIG. 9D is an enlarged view showing an encircled region in FIG. 9B.

As shown FIG. 9B, through-holes 41*b*, 42*b* and 43*b* piercing the piezoelectric sheets 41, 42 and 43 respectively are formed under each ground electrode 38. As shown in FIG. 9D, the through-holes 41*b*, 42*b* and 43*b* are filled with an electrically conductive material (such as silver-palladium) 49. Each ground electrode 38 is connected to the common electrodes 33 and 34 through the electrically conductive material 49.

Incidentally, each of the aforementioned individual electrodes 35 and 36 and the aforementioned common electrodes 33 and 34 is made of a metal material such as Ag—Pd.

The common electrode 33 (or 34) need not be constituted by a single electrically conductive sheet extending on the whole surface of the piezoelectric sheet. For example, a large number of common electrodes 33, 34 each of which is larger than a corresponding pressure chamber 10 so that a projected region in the lamination direction contains the pressure chamber region may be formed for each pressure chamber 10. Or a large number of common electrodes 33, 34 each of which is slightly smaller than a corresponding pressure chamber 10 so that the pressure chamber region contains the projected region may be formed for each pressure chamber 10. In this case, it is however necessary to electrically connect the large number of common electrodes to one another so that all portions corresponding to the pressure chambers 10 are kept at the same electric potential.

Incidentally, as shown in FIGS. 8 and 10, besides the individual electrodes 35 and the ground electrodes 38, a large number of dummy contact portions 39 are provided on the uppermost piezoelectric sheet 41. The dummy contact portions 39 are provided between the individual electrodes 35 arranged in the form of a matrix. The dummy contact portions 39 support the FPC sheets 50 disposed on the piezoelectric sheet 41 to prevent the FPC sheets 50 caved in between the contact portions 91 of the individual electrodes 35 from disturb the deformation of the piezoelectric sheet 41 at the time of ink ejection.

Next, the driver ICs 80 and the FPC sheets 50 (50*a* and 50*b*) will be described.

The driver ICs 80 (functioning as a drive unit) is electrically connected to the board 81 (functioning as a signal supply unit) and the plurality of individual electrodes 35 through the FPC sheets 50. The driver ICs 80 selectively apply voltage (supply the drive signals) to the plurality of individual electrodes 35 on the basis of signals that are supplied from the board 81 and are used to drive the driver ICs 80. Thereby, the pressure chambers 10 corresponding to the individual electrodes 35 to which the voltage is applied is changed its volume, and ink ejected from the nozzles 8 communicating with such pressure chambers 10.

Figure 15A:
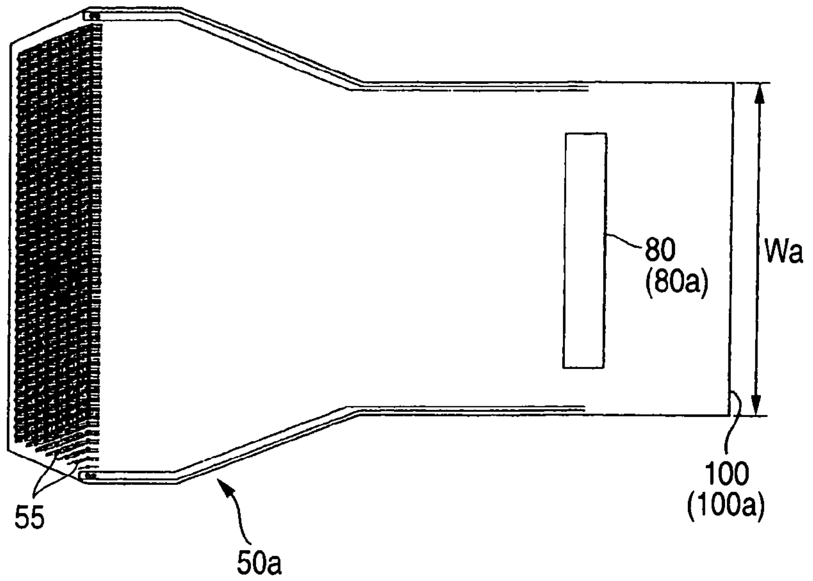
FIG. 15A is a plan view showing a lower flexible printed circuit (FPC) board.
Figure 15B:
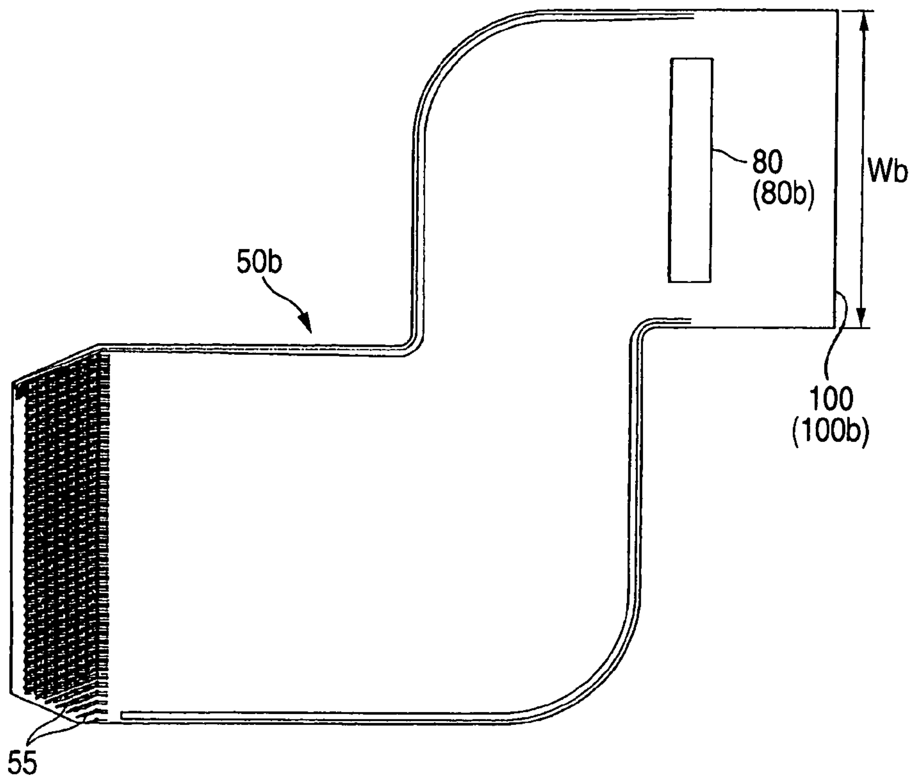
FIG. 15B is a plan view showing an upper FPC sheet.

As shown in FIGS. 15A and 15B, the FPC sheets 50 (50*a*, 50*b*) electrically connects the board 81 with the driver IC 80 while electrically connects the driver IC 80 with the individual electrodes 35, 36 and the common electrodes 33, 34. As shown in FIGS. 9A and 9B, FPC sheet 50 has connection pads 55 and 60 which are electrically connected to the individual electrodes 35 and the ground electrodes 38 arranged on the upper surface of the uppermost piezoelectric sheet 41, by means of soldering. The driver ICs 80 (80*a*, 80*b*) are mounted on the FPC sheets 50, respectively. When connection portions 100 (10*a*, 100*b*) that are provided at an end portion opposite to another end portion connected to the individual electrodes 35 are inserted into a connector portion (not shown) of the boards 81, the driver ICs 80 are electrically connected to the boards 81.

In the inkjet head 1 according to this embodiment, the plurality of pressure chambers 10 are arranged densely in the form of a matrix (see FIG. 5). Accordingly, the contact portions 91 of the individual electrodes 35 corresponding to the plurality of pressure chambers 10 are also arranged densely on the piezoelectric sheet 41. However, the width of the FPC sheet is limited. Therefore, the arrangement of a plurality of signal lines on a single FPC sheet to supply drive signals to the densely arranged individual electrodes 35 respectively is limited (in this embodiment, 664 signal lines are required to correspond to 664 individual electrodes).

In the inkjet head 1 of this embodiment, the plurality of individual electrodes 35 are divided into two individual-electrode groups 101, 102. Numbers of the individual electrodes in the two groups are different from each other. Specifically, the group 101 includes 8 rows and 364 individual electrodes on the upper side of FIG. 8. The group 102 includes 8 rows and 300 individual electrodes on the lower side of FIG. 8. The FPC sheets 50*a*, 50*b* electrically connects the two individual-electrode groups 101, 102 to the driver ICs 80*a*, 80*b*, respectively. As shown in FIGS. 8, 10, 15A, and 15B, the two FPC sheets 50*a*, 50*b* are arranged on the piezoelectric sheet 41 while they partially overlap each other. The two FPC sheets 50*a*, 50*b* functions as wiring from the driver ICs 80*a*, 80*b* to the contact portions 91 of the plurality of individual electrodes 35.

Generally, it is difficult to divide the plurality of individual electrodes 35 into a plurality of individual-electrode groups in which numbers of the individual electrodes 35 are equal to each other. Therefore, in this embodiment, the individual electrodes 35 are divided into the two individual-electrode groups 101, 102 in which numbers of the individual electrodes 35 are different from each other as described above. If a specification (inner circuit configuration, number of output terminals, and the like) of a drive unit (a driver IC 80) were determined, it would be required to design a plurality of driver units independently. As a result, cost of the driver units would increase. This embodiment solves this problem as follows.

The driver ICs 80*a*, 80*b* connected to the two FPC sheets 50*a*, 50*b* respectively supply the drive signals to the individual-electrode group 101, 102 in which number of the individual electrodes are different from each other. However, the driver ICs 80*a*, 80*b* have the same configuration and the same circuit configuration. Structures of the driver ICs 80 (80*a*, 80*b*) having the same specification will be described in detail below.

Figure 11:
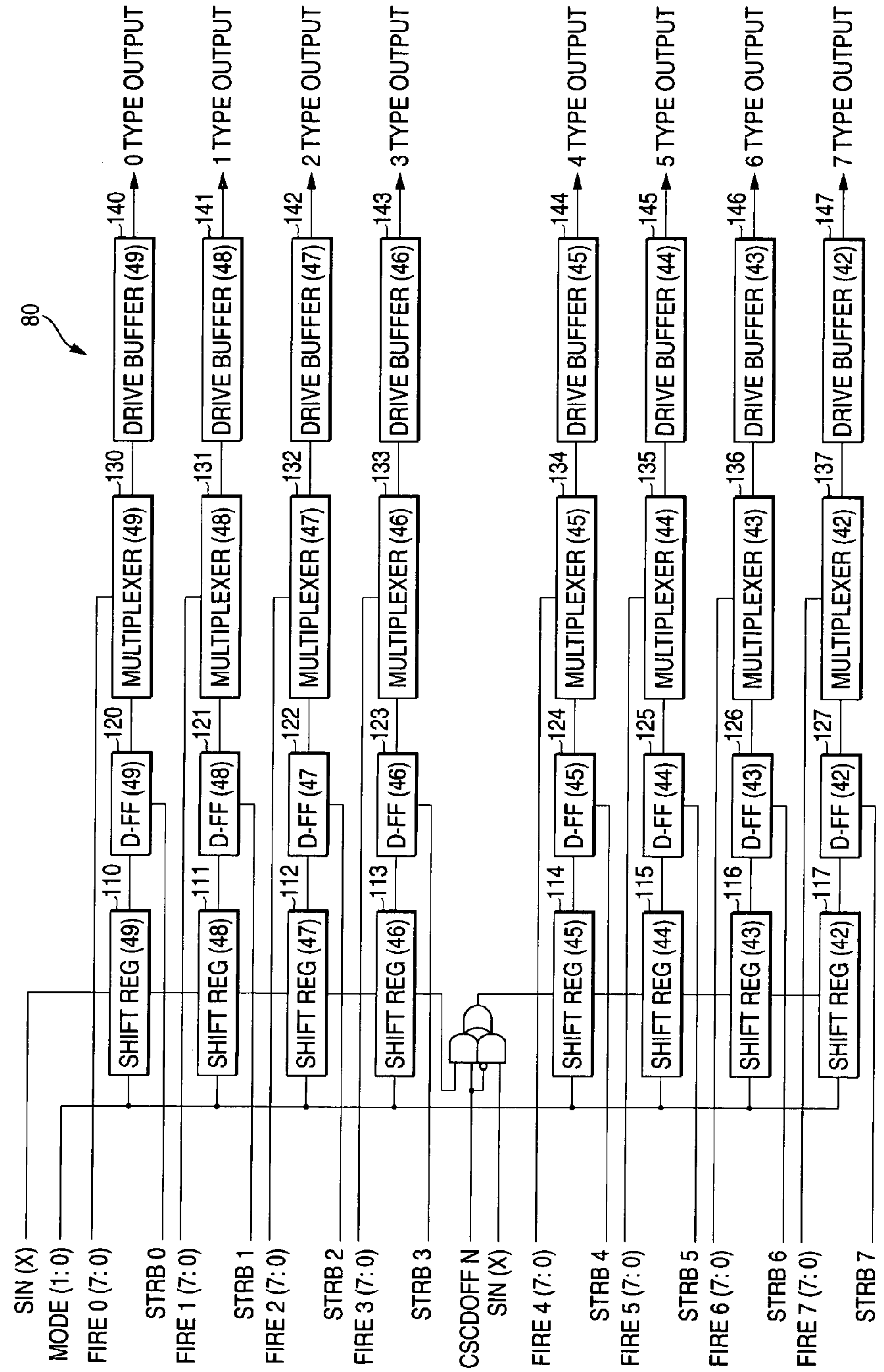
FIG. 11 is a block diagram of a driver IC.
Figures 12, 13:
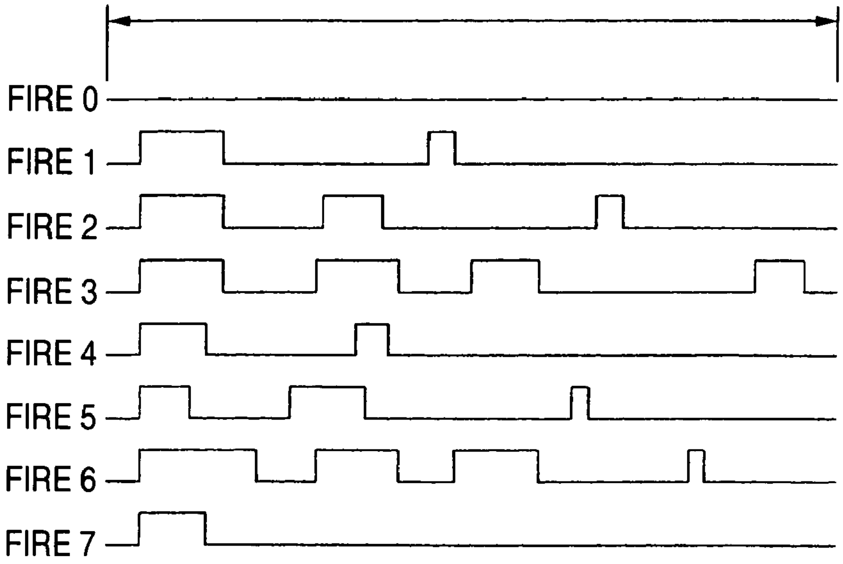
FIG. 12 is a view showing eight types of waveform signals.
FIG. 13 is a view showing a correspondence relation between selection data and the waveform signals.

As shown in FIG. 11, plural types of waveform signals (FIRE) are input into the driver IC 80 from the board 81. The driver IC 80 is configured to output the drive signal to each individual electrode on the basis of these plural types of waveform signals. FIG. 12 shows eight types of waveform signals FIRE (0) to FIRE (7) as an example of the waveform signals. FIRE (0) is a non-ejection signal for not ejecting ink from the nozzle 8. Also, three types of waveform signals FIRE (1) to FIRE (3) are pulse-train signals, which are different from each other in number of times the signal becomes Hi. FIRE (1) to FIRE (3) are waveform signals for making frequency of ink ejection from the nozzle 8 be different in response to the number of times the signal becomes Hi, to execute gradation control. FIRE (1) to FIRE (3) are waveform signals for ejecting ink droplets having small size, middle size, and large size, respectively. That is, during a printing period, the ink droplet is ejected once in the case of FIRE (1); twice in the case of FIRE (2); and three times in the case of FIRE (3). FIRE (4) to FIRE (6) are waveform signals that are selected when the ink droplets having the small size, middle size, and large size are ejected while an external disturbance such as fluctuation of temperature occurs. Incidentally, in the waveforms FIRE (1) to FIRE (6), a pulse, which has a relatively narrow width and is added to the last, is a stop pulse for suppressing vibration of ink remaining in the pressure chambers 10 after the ink droplet is ejected. Furthermore, FIRE (7) is a waveform signal that is selected when a flushing operation for the nozzles 8 are executed. The driver IC 80 selects anyone of the eight types of waveform signals FIRE (0) to FIRE (7) for each channel and supplies drive signals, which are generated on the basis of the selected waveform signals, to the individual electrodes 35 to eject ink from the nozzles 8.

Furthermore, as shown in FIG. 11, a selection data SIN (x) (x has 0, 1, or 2) of three bits used for selecting anyone of the aforementioned eight types of waveform signals FIRE (0) to FIRE (7) with respect to each nozzle 8 (each channel) is serially input to the driver IC 80. Then, as shown in FIG. 13, based on the selection data SIN (x) of three bits input to each channel, anyone of the eight types of waveform signals FIRE (0) to FIRE (7) is selected with respect to the channel.

Also, the driver IC 80 includes shift registers 110 to 117, D-flip flops 120 to 127 functions as latch circuits, multiplexers 130 to 137, and drive buffers 140 to 147. The shift registers 110 to 117 functions as a serially parallel converter that parallel-converts the selection data SIN (x) of three bits, which is serially input. The multiplexers 130 to 137 select anyone of the aforementioned eight types of waveform signals FIRE (0) to FIRE (7) on the basis of the selection data SIN (x) each corresponding to the plurality of channels. The drive buffers 140 to 147 output the waveform signals, which are output from the multiplexers 130 to 137, to the plurality of individual electrodes 35 as drive signals having a predetermined voltage.

Here, as shown in FIG. 11, the single driver IC 80 is divided into eight blocks (0 system to 7 system). Each of the eight blocks corresponds to row of eight-rows individual electrodes 35 that makes up the individual-electrode groups 101, 102 shown in FIG. 8. The eight blocks include 49 output terminals (0 system) at maximum to 42 output terminals (7 system), respectively. The single driver IC 80 (80*a*) includes 364 output terminals (a total number of output terminals from 0 system to 7 system) and can output drive signals to respective 364 individual electrodes 35, which make up the upper half individual-electrode group 101 in FIG. 8. Also, when some of the output terminals are placed in an unconnection state where the some of output terminals are not connected to the individual electrodes 35, the driver IC 80 having the same configuration can output the driver signals to a group made up of the individual electrodes number of which is less than 364 (specifically, the individual-electrode group 100 of made up of 300 individual electrodes on a lower half of FIG. 8 or a individual-electrode group made up of 304 individual electrodes 35). An inner configuration of the driver IC 80 will be described in detail below with using the block (0 system), which can output the drive signals to 49 individual electrodes 35 at maximum, among the eight blocks.

Figure 14:
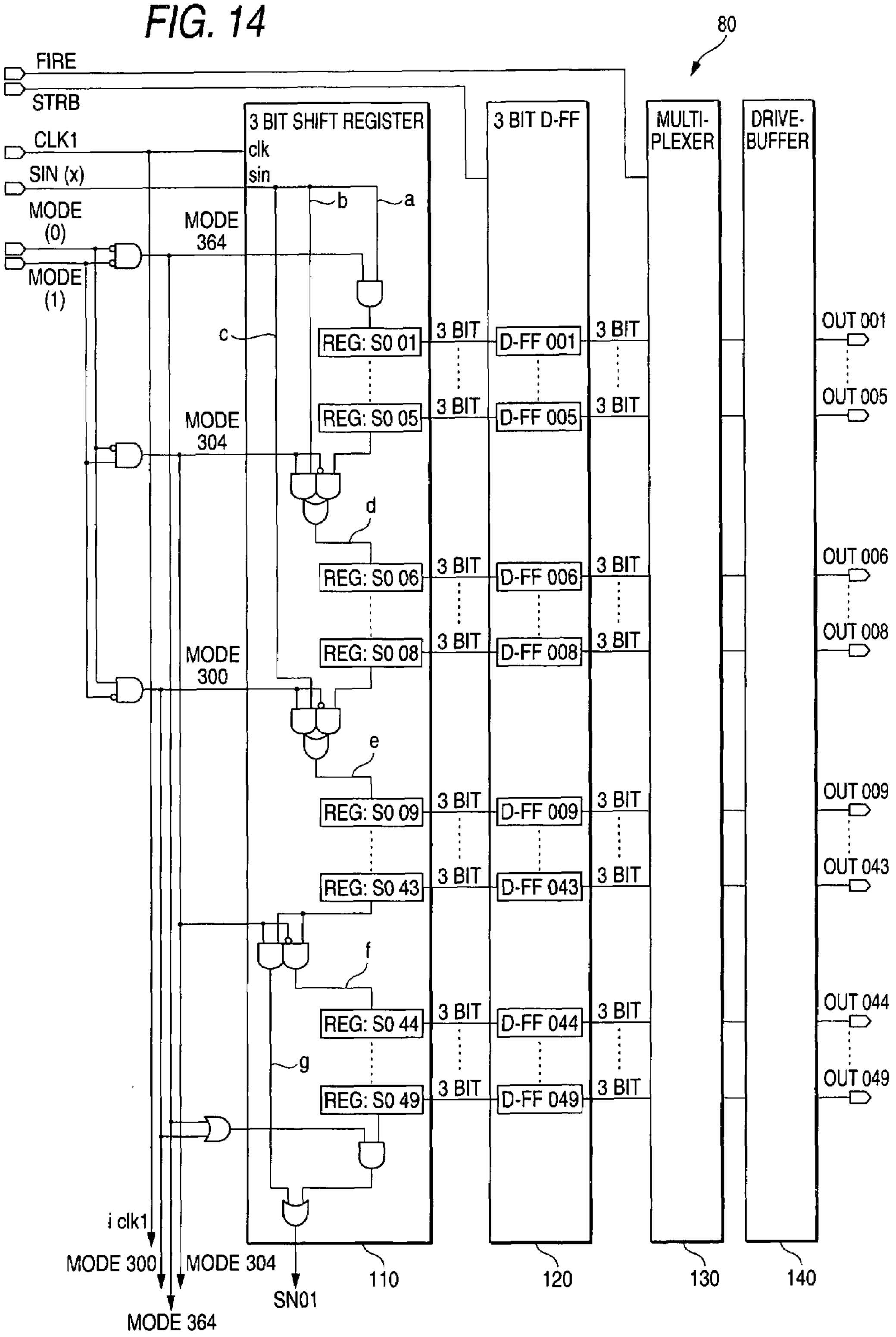
FIG. 14 is a block diagram of a part of the driver IC (0 system).

As shown in FIG. 14, the selection data SIN (x) of three bits is serially input from the board 81 to the shift register 110 of the 0 system of the driver IC 80 in accordance with rising of CLK. Furthermore, two mode identification data mode (0) and mode (1), which is used to identify which 364, 304, or 300 the number of individual electrodes 35 connected to the output terminal of the driver IC 80 is, are input to the shift register 110. Then, one of mode 364, mode 304, and mode 300 is determined on the basis of the mode identification data mode (0) and mode (1).

As shown in FIG. 14, when the both mode identification data mode (0) and mode (1) have Low, mode 364 has Hi; and mode 304 and mode 300 have Low. As a result, the driver IC 80 is placed in a mode corresponding to a state where the output terminals are connected to 364 individual electrodes 35. At this time, the selection data SIN (x) passes through paths a→d→e→f in FIG. 14 and is set to all the shift registers.

When the mode identification data mode (0) has Low and mode (1) has Hi, mode 304 has Hi; and mode 364 and mode 300 have Low. As a result, the driver IC 80 is placed in a mode corresponding to a state where the output terminals are connected to 304 individual electrodes 35. At this time, only the selection data SIN (x), which passes through paths b→d→e →g in FIG. 14 and is set to the shift register, become valid. That is, data of the selection data SIN (x), which passes through the paths a and d and is set to the registers, are invalid. Therefore, OUT001 to 005 and OUT044 to 049, which correspond to such outputs, are not connected.

Furthermore, when the mode identification data mode (0) has Hi and mode (1) has Low, mode 300 has Hi; and mode 364 and mode 304 have Low. As a result, the driver IC 80 is placed in a mode corresponding to a state where the output terminals are connected to 300 individual electrodes 35. At this time, only data of the selection data SIN (x), which passes through paths c→e→f in FIG. 14 and is set to the shift register, become valid. That is, the selection data SIN (x), which passes through the paths a and d and is set to the registers, are invalid. Therefore, OUT001 to 008, which correspond to such outputs, are not connected.

As described above, the number of individual electrodes 35 connected to the driver IC 80 is determined to be 364, 304, or 300 on the basis of mode 364, mode 304, and mode 300. Among the selection data SIN (x) serially input to the driver IC 80, only the selection data SIN (x) for the individual electrodes 35 that is connected are valid. In the other seven blocks (the 1 system to the 7 system), the shift registers 121 to 127 have the same configuration as the shift register 120 of the 0 system. Thereby, even if number of the individual electrodes 35 that are connected is different, the driver IC 80 having the same specification can output the drive signals to the individual electrodes 35. Also, since the shift registers 120 to 127 are configured as above, it is not necessary to purposely serially input to the driver IC 80 dummy selection data for the output terminals that are not connected. Therefore, it can be prevented that in order to transmit the dummy data, transmission takes long time.

Incidentally, in this embodiment, when the driver IC 80 is connected to the group 101 of 364 individual electrodes on the upper half side of FIG. 8, mode 364 has Hi. When the driver IC 80 is connected to the group 102 of 300 individual electrodes on the lower half side of FIG. 8, mode 300 has Hi. This embodiment can adapt to a case where the group 101 of upper half individual electrodes or the group 102 of lower half individual electrodes are made up of 304 individual electrodes 35 and the driver IC 80 is connected to such group of individual electrodes 35. In that case, mode 304 has Hi.

Then, as shown in FIGS. 11 and 14, the shift registers 110 to 117 parallel-covert and output the serially-input selection data SIN (x) of three bits to the D-flip flops 120 to 127. The D-flip flops 120 to 127 output the selection data to the multiplexers 130 to 137 in accordance with rising of strobe control signals STRB transmitted from the board 81 (se FIG. 2).

The selection data each corresponding to the plurality of individual electrodes 35 and the eight types of waveform signals FIRE0 to FIRE7 are input to the multiplexers 130 to 137. Then, the multiplexers 130 to 137 select one corresponding waveform signal among the eight types of waveform signals FIRE0 to FIRE7 on the basis of the selection data (see FIG. 13). The multiplexers 130 to 137 output the waveform signal Bx to the drive buffers 140 to 147.

The drive buffers 140 to 147 generate drive signals OUTn (n is an integer from 001 to 364) having the predetermined voltage on the basis of the waveform signal output from the multiplexers 130 to 137, and supply the drive signals OUTn to the individual electrodes 35.

As described above, the two driver ICs 80 (80*a*, 80*b*) that are respectively connected to the two individual-electrode groups 101, 102 made up of the individual electrodes 35 in which number of the individual electrodes 35 (364 and 300) are different from each other are made to be completely same in the specification. Therefore, in comparison with a case where driver ICs, which have different specifications, are provided for the two individual-electrode groups 101, 102, this embodiment has advantage in cost. Also, each of the individual-electrode groups 101, 102 is electrically connected to each of the two driver ICs corresponding to the individual-electrode groups 101, 102 through the single FPC sheet 50*a* (50*b*). Therefore, a connection relation between the individual-electrode groups 101, 102 and the driver ICs 80 is simple. Also, it is easy to connect the FPC sheet 50 (50*a*, 50*b*) to the driver ICs 80.

Next, the two FPC sheets 50*a*, 50*b* will be described in detail.

As shown in FIGS. 9A and 9B, each FPC sheet 50 has a base film 51, electric conductor portions 53 and 54 provided on a lower surface of the base film 51, and a cover film 52 provided on the almost whole lower surface of the base film 51 so that the electric conductor portions 53 and 54 are covered with the cover film 52. The FPC sheet 50 is disposed so that the cover film 52 abuts on the upper surface of the uppermost piezoelectric sheet 41. Incidentally, each of the base film 51 and the cover film 52 is an electrically insulating sheet member.

Also, as shown in FIGS. 15A and 15B, the connection portions 100 (100*a*, 100*b*) connected to the respective boards 81 are provided at the end portion (right side in FIG. 15) of the two FPC sheets 50*a*, 50*b* opposite to the other end portion connected to the individual electrodes. Here, a connection width Wa of the connection portion of the FPC sheet 50*a* is equal to a connection width Wb of the connection portion of the FPC sheet 50*b*. The two FPC sheets 50*a*, 50*b* can be connected to the boards 81 in the same way. Therefore, a connection operation can be executed quickly.

As shown in FIG. 9A, electrically conductive connection spads 55 are provided on the lower surface of the base film 51 so that each connection pad 55 is located at a position corresponding to an end of a corresponding individual electrode 35. That is, connection pads 55 are provided at positions corresponding to the contact portions 91 of the individual electrodes 35 respectively. Accordingly, one connection pad 55 is provided for one individual electrode 35. As shown in FIG. 9B, electrically conductive connection pads 60 are provided on the lower surface of the base film 51 so as to be located at positions corresponding to the ground electrodes 38 formed in the neighbors of outer edge portions of the upper surface of the actuator unit 21.

As shown in FIGS. 9A and 9B, through-holes 52*a* and 52*b* slightly larger in diameter than the connection pads 55 and 60 are formed in portions of the cover film 52 corresponding to the connection pads 55 and 60. Accordingly, almost the whole of the lower surface of the base film 51 except the connection pads 55 and 60 located in positions corresponding to the through-holes 52*a* and 52*b* is covered with the cover film 52.

The electric conductor portions 53 and 54 disposed between the base film 51 and the cover film 52 are made of copper foil. A plurality of signal lines for connecting the connection pads 55 to the driver ICs 80 are wired by the electric conductor portions 53. On the other hand, the electric conductor portions 54 are provided for grounding the connection pads 60. Accordingly, the electric conductor portions 53 and 54 are provided so as to form predetermined patterns on the lower surface of the base film 51. Although FIGS. 15A and 15B show the case where a plurality of signal lines are drawn only in portions where the two FPC sheets 50*a* and 50*b* overlap the piezoelectric sheet 41. However, the plurality of signal lines actually extend in parallel from the connection pads 55 connected to the individual electrodes 35 respectively to the driver ICs 80.

When the FPC sheets 50 having the connection pads 55 and 60 are disposed on the upper surface of the piezoelectric sheet 41 having the individual electrodes 35 and the ground electrodes 38 formed thereon as described above, the connection pads 55 are electrically connected to the individual electrodes 35 respectively while the connection pads 60 aee electrically connected to the ground electrodes 38 respec0tively. Accordingly, the individual electrodes 35 are electrically connected to the driver ICs 80 through the connection pads 55 and the electric conductor portions 53 while the ground electrodes 38 are grounded at not-shown regions through the connection pads 60 and the electric conductor portions 54.

The individual electrodes 35 are connected to the driver ICs 80 through the electric conductor portions 53 which are provided independently and individually. A pair of individual electrodes 35 and 36 corresponding to each pressure chamber 10 are connected to each other through the electrically conductive material 48 provided in the through-holes 41*a* and 42*a* formed in the piezoelectric sheets 41 and 42 respectively. Accordingly, the electric potential of the individual electrodes 35 and 36 can be controlled for each pressure chamber 10 independently.

All the ground electrodes 38 are connected to the common electrode 33 through the electrically conductive material 49 provided in the through-holes 41*b* formed in the piezoelectric sheet 41. The common electrodes 33 and 34 are connected to each other through the electrically conductive material 49 provided in the through-holes 42*b* and 43*b* formed in the piezoelectric sheets 42 and 43 respectively. Accordingly, the common electrodes 33 and 34 connected to the ground electrodes 38 grounded through the connection pads 60 and the electric conductor portions 54 are kept at ground potential equally in regions corresponding to all the pressure chambers 10.

Incidentally, as shown in FIGS. 8, 11A and 11B, in the inkjet head 1, two FPC sheets 50*a* and 50*b* are disposed on the uppermost piezoelectric sheet 41 so as to partially overlap each other. The connection pads 55 of the lower one 50*a* of the two FPC sheets 50 are respectively connected to the contact portions 91 of the individual electrodes 35 disposed on the upper side of the piezoelectric sheet 41 in FIG. 8. On the other hand, the connection pads 55 of the upper one 50*b* of the two FPC sheets 50 are respectively connected to the contact portions 91 of the individual electrodes 35 disposed on the lower side of the piezoelectric sheet 41 in FIG. 8.

When the two FPC sheets 50*a* and 50*b* are disposed on the piezoelectric sheet 41 so as to over lap each other in this manner, the upper FPC sheet 50*b* in the boundary 92 between the overlapping portion of the two FPC sheets 50*a* and 50*b* and the non-overlapping portion is however forced to be deformed more largely than the thickness of the lower FPC sheet 50*a* to avoid the lower FPC sheet 50*a* at the short distance crossing the boundary 92. It is noted that the non-overlapping portion may represent a portion other than the overlapping portion. Connection between the contact portion 91 of each individual electrode 35 and a corresponding connection pad 55 of the FPC sheet 50*b* has a low tolerance to application of external force. For this reason, the connection pads 55 of the upper FPC sheet 50*b* will be disconnected from the contact portions 91 to cause connection failure when external force acts on the upper FPC sheet 50*b* in a direction of peeling the upper FPC sheet 50*b* upward.

Figure 16:
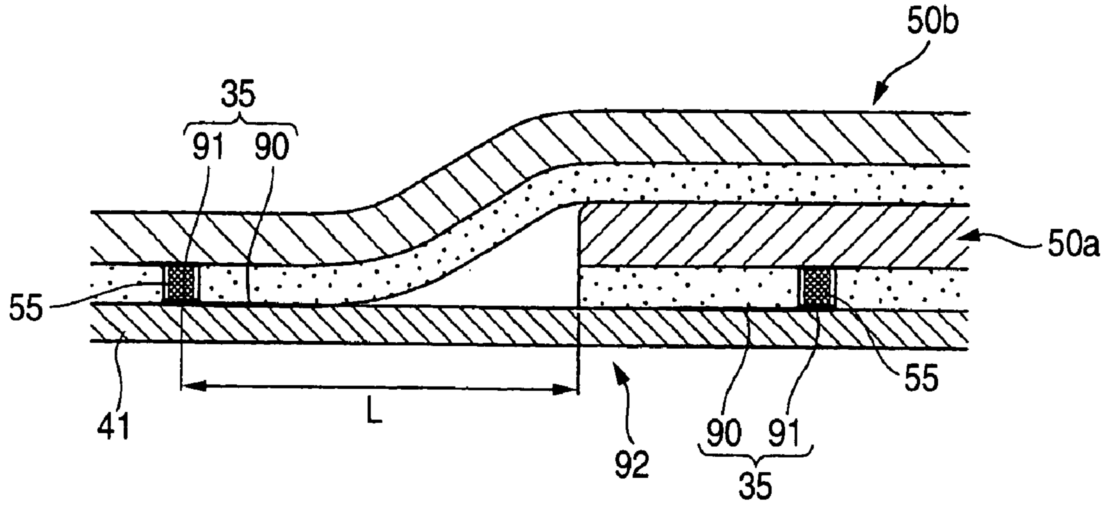
FIG. 16 is a sectional view taken along the line A-A in FIG. 10.

Therefore, as shown in FIGS. 8 and 10, on the piezoelectric sheet 41, the contact portions 91 of all the individual electrodes 35 are provided at end portions of the individual electrodes 35 on a side of departing from the boundary 92. In other words, at least a part of the electrodes 35 of the individual-electrode group 101, which are adjacent to one end portion (92) of the flexible printed circuit sheet 50*a*, include the contact portions 91 at the upper end portions thereof. At least a part of the electrodes 35 of the individual-electrode group 102, which are adjacent to the one end portion (92) of the flexible printed circuit sheet 50*b*, include the contact portions 91 at the lower end portions thereof. Specifically, the contact portions 91 of the individual electrodes 35 disposed on an upper half of the piezoelectric sheet 41 in FIG. 8 are provided at upper end portions of the individual electrodes 35 in FIG. 8. On the other hand, the contact portions 91 of the individual electrodes 35 disposed on a lower half of the piezoelectric sheet 41 in FIG. 8 are provided at lower end portions of the individual electrodes 35 in FIG. 8. According to this configuration, the distance L between the contact portion 91 near the boundary 92 and the boundary 92 becomes large as shown in FIG. 16. Therefore, the upper FPC sheet 50*b* and the contact portion 91 can be connected to each other in a position as far as possible from the boundary 92 in which the FPC sheet 50*b* is apt to be peeled. Hence, reliability on the electrical connection can be improved.

The contact portions 91 of all the individual electrodes 35 on the piezoelectric sheet 41 are provided at end portions of the individual electrodes 35 on the side of departing from the boundary 92. Accordingly, in each of two upper and lower regions separated by the boundary 92 in FIG. 8, the contact portions 91 of the individual electrodes 35 are arranged in the same direction. For this reason, places where the distance between the contact portions 91 is locally short can be eliminated. The contact portions 91 can be patterned easily while short-circuiting between the contact portions 91 is prevented to the utmost.

Incidentally, as shown in FIGS. 8 and 10, the dummy contact portions 39 provided in the neighbor of the boundary 92 are denser than the dummy contact portions 39 provided in other places than the boundary 92. For this reason, the dummy contact portions 39 provided densely in the neighbor of the boundary 92 in which the distance between the contact portions 91 is large can prevent the FPC sheets 50 from being caved in.

In the inkjet head 1 according to this embodiment, the piezoelectric sheets 41 to 43 are polarized in the direction of the thickness thereof. Accordingly, when an electric field in the direction of polarization is applied on the piezoelectric sheets 41 to 43 in the condition that the electric potential of the individual electrodes 35 and 36 is set at a value different from the electric potential of the common electrodes 33 and 34, the portion on which the electric field is applied serves as an active layer and expands or shrinks in the direction of thickness of the piezoelectric sheets 41 to 43, that is, in the direction of lamination. As a result, the piezoelectric sheets 41 to 43 are to shrink or expand in a direction perpendicular to the direction of lamination, that is, in a planar direction because of the transverse piezoelectric effect. On the other hand, the residual two piezoelectric sheets 44 and 45 cannot be deformed spontaneously because they are non-active layers having no region put between the individual electrode 35, 36 and the common electrode 33, 34. That is, the actuator unit 21 has a so-called unimorph type structure in which the three piezoelectric sheets 41 to 43 on the upper side (i.e. far from the pressure chambers 10) are used as layers including active layers formed therein while the two piezoelectric sheets 44 and 45 on the lower side (i.e. near to the pressure chambers 10) are used as non-active layers.

Accordingly, when the driver ICs 80 are controlled to make the direction of electric field be equal to the direction of polarization to set the electric potential of an individual electrode 35, 36 at a predetermined positive or negative value, the active layers of the piezoelectric sheets 41 to 43 put between the individual electrode 35, 36 and the common electrode 33, 34 shrink in the planar direction while the piezoelectric sheets 44 and 45 do not shrink spontaneously. On this occasion, as shown in FIG. 9A, the lower surface of the whole of the piezoelectric sheets 41 to 45 is fixed to the upper surface of the partition wall that defines the pressure chambers 10 and is formed in the cavity plate 22. As a result, the piezoelectric sheets 41 to 45 are deformed (unimorph deformation) so as to be curved convexly on the pressure chamber 10 side on the basis of the transverse piezoelectric effect. Then, the volume of the pressure chamber 10 is reduced to increase the pressure of ink to thereby eject ink from a nozzle 8 connected to the pressure chamber 10. When the electric potential of the individual electrode 35, 36 is then returned to the original value, the piezoelectric sheets 41 to 45 are restored to the original flat shape. As a result, the volume of the pressure chamber 10 is returned to the original value, so that ink is sucked from the manifold 5 side.

Incidentally, another drive method may be used as follows. The electric potential of each individual electrode 35, 36 is set at a value different from the electric potential of the common electrode 33, 34 in advance. Whenever there is an ejection request, the electric potential of the individual electrode 35, 36 is once changed to the same value as the electric potential of the common electrode 33, 34. Then, the electric potential of the individual electrode 35, 36 is returned to the original value different from the electric potential of the common electrode 33, 34 at predetermined timing. In this case, the piezoelectric sheets 41 to 45 are restored to the original shape at the timing when the electric potential of the individual electrode 35, 36 becomes equal to the electric potential of the common electrode 33, 34. Accordingly, the volume of the pressure chamber 10 is increased compared with the initial state (in which the common electrode and the individual electrode are different in electric potential from each other), so that ink is sucked from the manifold 5 side into the pressure chamber 10. Then, the piezoelectric sheets 41 to 45 are deformed so as to be curved convexly on the pressure chamber 10 side at the timing when the electric potential of the individual electrode 35, 36 is set at the original value different from the electric potential of the common electrode 33, 34 again. As a result, the volume of the pressure chamber 10 is reduced to increase the pressure of ink to thereby eject ink.

If the direction of the electric field applied on the piezoelectric sheets 41 to 43 is reverse to the direction of polarization of the piezoelectric sheets 41 to 43, the active layers in the piezoelectric sheets 41 to 43 put between the common electrode 33, 34 and the individual electrode 35, 36 is to expand in a direction perpendicular to the direction of polarization by the transverse piezoelectric effect. Accordingly, the piezoelectric sheets 41 to 45 are deformed so as to be curved concavely on the pressure chamber 10 side on the basis of the transverse piezoelectric effect. For this reason, the volume of the pressure chamber 10 is increased so that ink is sucked from the manifold 5 side. Then, when the electric potential of the individual electrode 35, 36 is returned to the original value, the piezoelectric sheets 41 to 45 are restored to the original planar shape. As a result, the volume of the pressure chamber 10 is returned to the original value, so that ink is ejected from the nozzle 8 connected to the pressure chamber 10.

According to the inkjet head 1 described above, the following effect can be obtained.

The two driver ICs 80 (80*a*, 80*b*) that are respectively connected to the two individual-electrode groups 101, 102 made up of the individual electrodes 35 in which number of the individual electrodes 35 (364 and 300) are different from each other can be made to be completely same in the specification. Therefore, in comparison with the case where driver ICs, which have different specifications, are provided for the two individual-electrode groups 101, 102, this embodiment has advantage in cost.

A wiring member that electrically connects the two individual-electrode groups 101, 102 and the two driver ICs 80 corresponding to the two individual-electrode groups 101, 102 respectively is configured by the FPC sheet 50 having flexibility. Therefore, the two FPC sheets 50*a*, 50*b* can be disposed on the actuator unit 21 while partially overlapping each other. Also, a degree of freedom of arrangement of the FPC sheet 50 and the driver IC 80 can be increased.

Because the contact portions 91 of all the individual electrodes 35 disposed on the piezoelectric sheet 41 are provided at the end portions of the individual electrodes 35 on the side of departing from the boundary 92, the distance between each contact portion 91 near the boundary 92 and the boundary 92 becomes large. Accordingly, the upper FPC sheet 50*b* and the contact portion 91 can be connected to each other at a position as far as possible from the boundary 92 in which the FPC sheet 50*b* is apt to be peeled. Reliability on the electrical connection can be improved. In each of the two upper and lower regions separated by the boundary 92 in FIG. 8, the contact portions 91 of the individual electrodes 35 can be arranged in the same direction. Therefore, places where the distance between the contact portions 91 is locally short can be eliminated. Hence, the contact portions 91 can be patterned easily while short-circuiting between the contact portions 91 is prevented to the utmost.

The individual electrodes 35 are formed so as to be long and narrow in a direction crossing the arrangement direction (first direction) along the boundary 92. The distance between each contact portion 91 and the boundary 92 becomes larger when the contact portions 91 of the individual electrodes 35 near the boundary 92 are provided at the end portions of the individual electrodes 35 on the side of departing from the boundary 92. Accordingly, the FPC sheet 50 and the contact portion 91 can be connected to each other in a position farther from the boundary 92.

The dummy contact portions 39 provided in the neighbor of the boundary 92 are denser than the dummy contact portions 39 provided in other places than the boundary 92. Therefore, the dummy contact portions 39 provided densely in the neighbor of the boundary 92 in which the distance between the contact portions 91 is large can surely prevent the deformation of the piezoelectric sheets 41 to 45 from being disturbed by the FPC sheets 50 caved in.

Next, a modified embodiment in which various modifications are applied to the aforementioned embodiment will be described.

Figure 17:
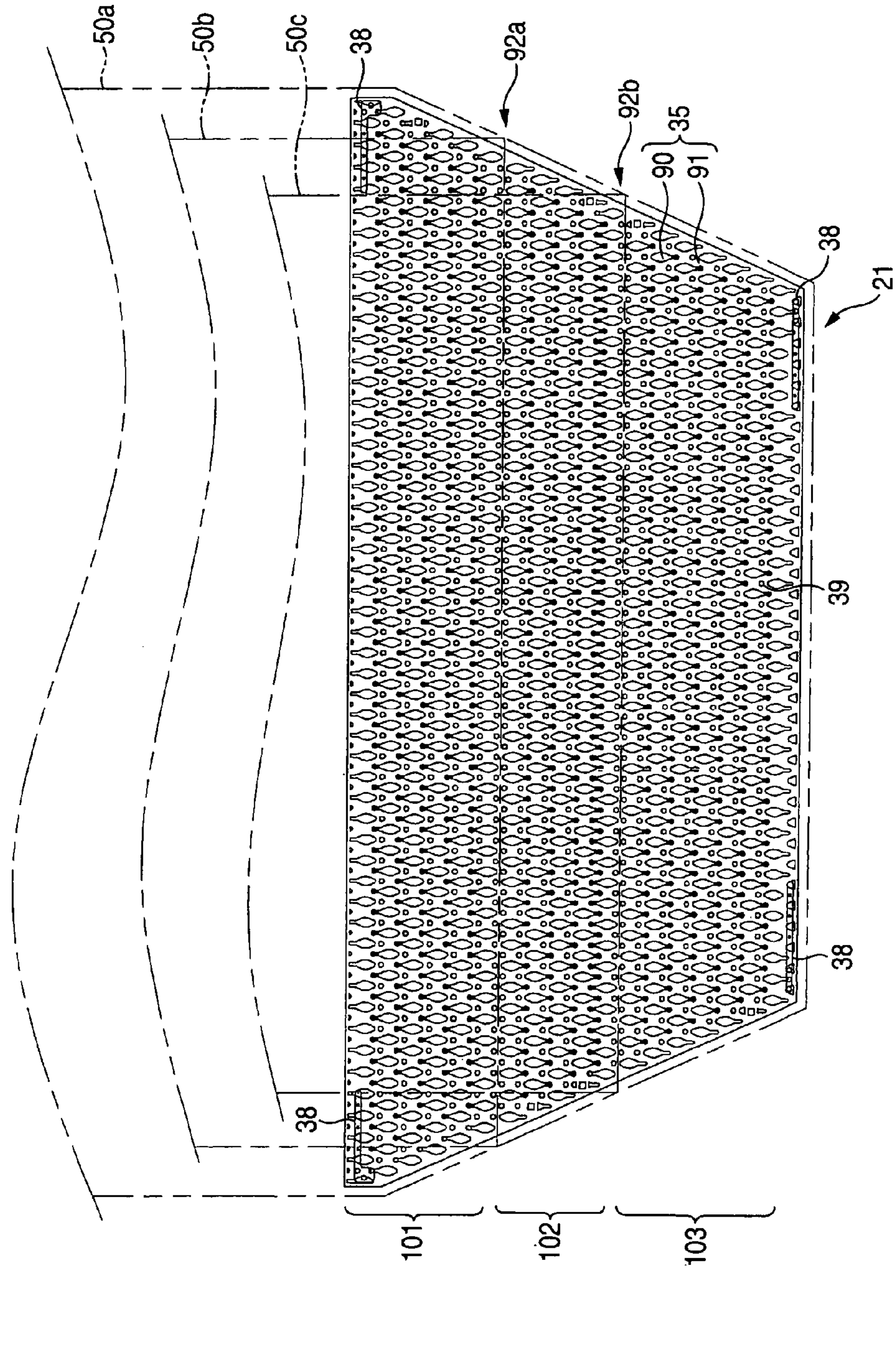
FIG. 17 is a plan view of an actuator unit according to a modified embodiment.

1] A way of connecting the plurality of individual electrodes 35 of the single actuator unit 21 with the driver ICs 80 is not limited to the above described embodiment. For example, the plurality of individual electrodes 35 may be divided into three (or more) individual-electrode groups 101, 102, 103 as shown in FIG. 17. Three (or more) the same driver ICs 80 that correspond to the three (or more) groups 101, 102, 103 may be provided. Also, three (or more) FPC sheets 50 (50*a*, 50*b*, 50*c*) may be disposed on the piezoelectric sheet 41 while overlapping each other.

A single FPC sheet 50 may connect the plurality of driver ICs 80 having the same configuration may to the plurality of individual electrodes 25. On the contrary, the plurality of FPC sheets 50 may connect a single driver IC 80 to the plurality of individual electrodes 35.

Figure 18:
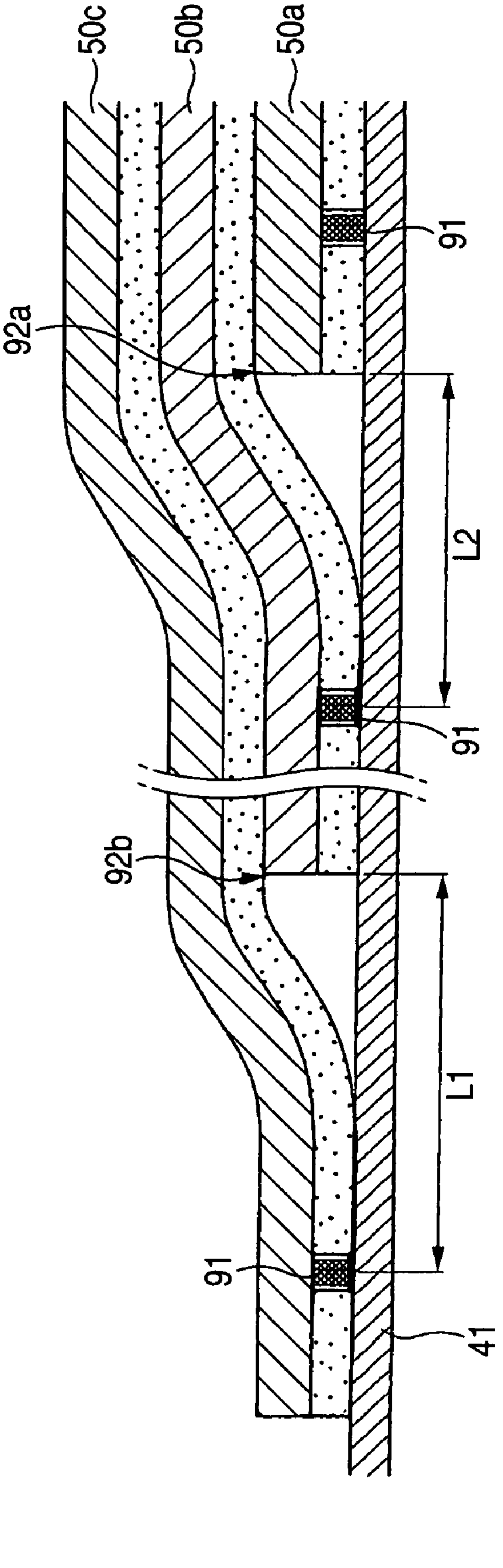
FIG. 18 is a sectional view of the flexible printed circuit sheets that partially overlap each other.

2] Only individual electrodes 35 near the boundary 92 between the overlapping portion of the plurality of FPC sheets 50 and the non-overlapping portion may be configured so that the contact portions 91 are provided at the end portions of the individual electrodes 35 on the side of departing from the boundary 92. Specifically, in FIG. 17, the individual electrodes 35 near a boundary 92*a* between a overlapping portion of the FPC sheets 50*b*, 50*c* and a non-overlapping portion is configured so that the contact portions 91 provided at the end portions of the individual electrodes 35 on the side of departing from the boundary 92*b*. In the individual-electrode group 102, the lowermost individual-electrode row near the boundary 92 has the contact portions 91 at the upper end portions of the individual electrodes 25. However, the other individual-electrode rows have the contact portions 91 at the lower end portions of the individual electrodes 25. According to this modification, the distances L1, L2 between the contact portions 91 near the boundaries 92*a*, 92*b* and the boundaries 92*a*, 92*b* become large as shown in FIG. 18. Therefore, the upper FPC sheets 50*b*, 50*c* and the contact portions 91 can be connected to each other in a position as far as possible from the boundaries 92*a*, 92*b* in which the FPC sheet 50*b* is apt to be peeled, respectively. Hence, reliability on the electrical connection can be improved.

3] In the aforementioned embodiment, the common electrodes 33, 34 are grounded. However, it is not necessary to ground the common electrodes. A drive signal, which is different from the drive signal supplied to the individual electrodes, may be supplied to the common electrodes so long as the actuator unit executes the same operation as the embodiment.

4] Materials of the piezoelectric sheets and the electrodes are not limited to the described above. They may be changed to another known material. Also, plan shapes, section shapes, arrangement mode and the like of the pressure chamber and the electrode may be changed appropriately. Also, number of the piezoelectric sheets including the active layer and number of the piezoelectric sheets not including the active layer may be changed appropriately. Also, thickness of the piezoelectric sheet including the active layer and thickness of the piezoelectric sheet not including the active layer may be equal to or different from each other. Also, an insulating layer other than the piezoelectric sheet may be used as a non-active layer.

5] As well as the FPC sheet 50 of the aforementioned embodiment, a flexible flat cable (FFC) or a general printed-wiring assembly having no flexibility may be used as a wiring member that connects the plurality of individual electrodes 35 to the driver ICs 80. Also, in a case where two or more layers of signal lines are provided in a single wiring member, it is not necessary to dispose a plurality of wiring members on the actuator unit 21 to overlap each other. In this case, a single wiring member may electrically connect a plurality of individual-electrode group in which numbers of the individual electrodes 35 are different to a plurality of driver ICs 80 corresponding to the individual-electrode groups respectively.

6] The invention may be applied to a recording head other than an inkjet head having a piezoelectric type actuator unit. For example, the invention may be applied to a recording head for a thermal printer or a dot printer.

What is claimed is:

1. An inkjet head comprising:

a flow-path unit including a plurality of pressure chambers that communicate with nozzles for ejecting ink, respectively; and an actuator unit that is disposed on a surface of the flow-path unit and changes volumes of the pressure chambers, wherein:

the actuator unit includes:

a piezoelectric sheet that is disposed over the pressure chambers;

a plurality of electrodes that are disposed on the piezoelectric sheet to correspond to the pressure chambers, respectively; and a plurality of flexible printed circuit sheets each of which includes a plurality of signal lines that are connected to contact portions of the electrodes, respectively and supply drive signals to the contact portions of the electrodes, respectively;

the flexible printed circuit sheets partially overlap each other on the piezoelectric sheet;

the flexible printed circuit sheets include first and second flexible printed circuit sheets;

the electrodes are divided into a plurality of electrode groups including first and second electrode groups;

each of the electrodes includes a first and second end portions that are opposite to each other;

at least a part of the electrodes of the first electrode group, which are adjacent to one end portion of the first flexible printed circuit sheet, include the contact portions contactable to the first flexible printed circuit sheet at the first end portions thereof;

at least a part of the electrodes of the second electrode group, which are adjacent to the one end portion of the first flexible printed circuit sheet, include the contact portions contactable to the second flexible printed circuit sheet at the second end portions thereof; and the one end portion of the first flexible printed circuit sheet is located between the first and second electrode groups.

2. The inkjet head according to claim 1, wherein the pressure chambers of the flow-path unit are arranged along a plane to be adjacent to each other.

3. The inkjet head according to claim 1, wherein the actuator unit changes the volumes of the pressure chambers to eject the ink from the nozzles.

4. The inkjet head according to claim 1, wherein the drive signals are signals for changing the volumes of the pressure chambers.

5. The inkjet head according to claim 1, wherein the second flexible printed circuit sheet is located on the one end portion of the first flexible printed circuit sheet.

6. The inkjet head according to claim 1, wherein the second end portion of each electrode of the first electrode group is closer to the one end portion of the first flexible printed circuit sheet than the first end portion thereof.

7. The inkjet head according to claim 1, wherein:

all the electrodes of the first electrode group include the contact portion at the first end portion thereof; and all the electrodes of the second electrode group include the contact portion at the second end portion thereof.

8. The inkjet head according to claim 1, wherein:

the actuator unit includes dummy contact portions that are disposed on the piezoelectric sheet and between the electrodes, and support the flexible printed circuit sheets; and the dummy contact portions are disposed more densely in neighbor of the one end portion of the first flexible printed circuit sheet than a portion other than the one end portion of the first flexible printed circuit sheet.

9. The inkjet head according to claim 1, wherein each of the electrodes elongates in a direction that intersects with an arrangement direction along the one end portion of the first flexible printed circuit sheet.

10. The inkjet head according to claim 9, wherein the direction in which the electrodes elongate is perpendicular to the arrangement direction.

11. The inkjet head according to claim 8, wherein:

each of the electrodes includes a main region above the pressure chamber and a sub region a sub region containing the contact portion; and the dummy contact portions are arrange on virtual lines that connect centers of the main regions and the contact portions.

12. The inkjet head according to claim 8, wherein each of the electrodes includes a main region above the pressure chamber and a sub region a sub region containing the contact portion; and the main regions face the dummy contact portions through the one end portion of the first flexible printed circuit sheet.

13. The inkjet head according to claim 12, wherein the dummy contact portion corresponding to a certain main region is disposed between other main regions that are adjacent to the certain main region through the one end portion of the first flexible printed circuit sheet.

14. The inkjet head according to claim 1, further comprising:

a plurality of drive units that are electrically connected to the electrodes; drive the actuator unit; and have same circuit configuration, wherein:

the drive units are connected to the electrode groups, respectively.

15. The inkjet head according to claim 14, further comprising:

a signal supply unit that supplies a signal for driving the drive units, wherein:

the flexible printed circuit sheets connect the electrode groups to the drive units through the signal lines;

each of the flexible printed circuit sheets includes a connection portion that is connected to the signal supply unit; and widths of the connection portions of the flexible printed circuit sheets are equal to each other.

16. The inkjet head according to claim 15, wherein one of the flexible printed circuit sheets electrically connects one of the electrode groups to one of the drive units.

17. The inkjet head according to claim 1, wherein the electrodes are further divided into a third electrode group.

* * * * *